(12) United States Patent
Hatakeyama et al.

(10) Patent No.: US 8,778,592 B2
(45) Date of Patent: Jul. 15, 2014

(54) POSITIVE RESIST COMPOSITION AND PATTERNING PROCESS

(75) Inventors: Jun Hatakeyama, Joetsu (JP); Takeshi Nagata, Joetsu (JP); Taku Morisawa, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 170 days.

(21) Appl. No.: 13/404,824

(22) Filed: Feb. 24, 2012

(65) Prior Publication Data

US 2012/0220112 A1    Aug. 30, 2012

(30) Foreign Application Priority Data

Feb. 25, 2011   (JP) ................. 2011-040065

(51) Int. Cl.
    *G03F 7/004*  (2006.01)
    *G03F 7/039*  (2006.01)
    *G03F 7/26*   (2006.01)
(52) U.S. Cl.
    USPC ........................ 430/270.1; 430/326
(58) Field of Classification Search
    USPC ............... 430/270.1, 326, 910, 315
    See application file for complete search history.

(56) References Cited

U.S. PATENT DOCUMENTS

| | | | |
|---|---|---|---|
| 5,372,912 A | 12/1994 | Allen et al. | |
| 6,045,968 A * | 4/2000 | Ushirogouchi et al. | 430/270.1 |
| 6,448,420 B1 | 9/2002 | Kinsho et al. | |
| 6,558,869 B1 * | 5/2003 | McCullough et al. | 430/270.1 |
| 7,482,108 B2 | 1/2009 | Matsumaru et al. | |
| 7,537,880 B2 | 5/2009 | Harada et al. | |
| 7,598,016 B2 | 10/2009 | Kobayashi et al. | |
| 7,771,913 B2 | 8/2010 | Kaneko et al. | |
| 2003/0114589 A1 * | 6/2003 | Suetsugu et al. | 525/132 |
| 2004/0076902 A1 * | 4/2004 | Nakanishi et al. | 430/270.1 |
| 2004/0191670 A1 * | 9/2004 | Ando et al. | 430/270.1 |
| 2007/0042292 A1 | 2/2007 | Yoneda et al. | |
| 2007/0111140 A1 * | 5/2007 | Hatakeyama et al. | 430/270.1 |
| 2008/0090172 A1 | 4/2008 | Hatakeyama et al. | |
| 2008/0153030 A1 | 6/2008 | Kobayashi et al. | |
| 2011/0254140 A1 * | 10/2011 | Pohlers | 257/632 |

FOREIGN PATENT DOCUMENTS

| | | |
|---|---|---|
| EP | 0 473 547 A1 | 3/1992 |
| JP | 04-230645 A | 8/1992 |
| JP | 2000-327633 A | 11/2000 |
| JP | 2005-84365 A | 3/2005 |
| JP | 2006-45311 A | 2/2006 |
| JP | 2008-111103 A | 5/2006 |
| JP | 3790649 B2 | 6/2006 |
| JP | 2006-178317 A | 7/2006 |
| JP | 2008-158339 A | 7/2006 |
| JP | 3796568 B2 | 7/2006 |
| JP | 3829913 B2 | 10/2006 |
| JP | 2007-79552 A | 3/2007 |
| JP | 2007-297590 A | 11/2007 |
| JP | 2008-122932 A | 5/2008 |
| JP | 2008-197606 A | 8/2008 |
| JP | 2008-239918 A | 10/2008 |
| JP | 2008-249993 A | 10/2008 |

* cited by examiner

*Primary Examiner* — Anca Eoff
(74) *Attorney, Agent, or Firm* — Westerman, Hattori, Daniels & Adrian, LLP

(57) ABSTRACT

A positive resist composition based on a polymer comprising recurring units of (meth)acrylate having a cyclic acid labile group and a dihydroxynaphthalene novolak resin, and containing a photoacid generator is improved in resolution, step coverage and adhesion on a highly reflective stepped substrate, has high resolution, and forms a pattern of good profile and minimal edge roughness through exposure and development.

6 Claims, No Drawings

POSITIVE RESIST COMPOSITION AND PATTERNING PROCESS

CROSS-REFERENCE TO RELATED APPLICATION

This non-provisional application claims priority under 35 U.S.C. §119(a) on Patent Application No. 2011-040065 filed in Japan on Feb. 25, 2011, the entire contents of which are hereby incorporated by reference.

TECHNICAL FIELD

This invention relates to a positive resist composition and a pattern forming process. More particularly, it relates to a chemically amplified positive resist composition comprising a specific polymer blend as base resin, suitable for use in the ion implantation process.

BACKGROUND ART

In the recent drive for higher integration and operating speeds in LSI devices, the pattern rule is made drastically finer. The photolithography which is currently on widespread use in the art is approaching the essential limit of resolution determined by the wavelength of a light source. As the light source used in the lithography for resist pattern formation, g-line (436 nm) or i-line (365 nm) from a mercury lamp was widely used in 1980's. Reducing the wavelength of exposure light was believed effective as the means for further reducing the feature size. For the mass production process of 64 MB dynamic random access memories (DRAM, processing feature size 0.25 µm or less) in 1990's and later ones, the exposure light source of i-line (365 nm) was replaced by a KrF excimer laser having a shorter wavelength of 248 nm. However, for the fabrication of DRAM with a degree of integration of 256 MB and 1 GB or more requiring a finer patterning technology (processing feature size 0.2 µm or less), a shorter wavelength light source was required. Over a decade, photolithography using ArF excimer laser light (193 nm) has been under active investigation. It was expected at the initial that the ArF lithography would be applied to the fabrication of 180-nm node devices. However, the KrF excimer lithography survived to the mass-scale fabrication of 130-nm node devices. So, the full application of ArF lithography started from the 90-nm node. The ArF lithography combined with a lens having an increased numerical aperture (NA) of 0.9 is considered to comply with 65-nm node devices. For the next 45-nm node devices which required an advancement to reduce the wavelength of exposure light, the $F_2$ lithography of 157 nm wavelength became a candidate. However, for the reasons that the projection lens uses a large amount of expensive $CaF_2$ single crystal, the scanner thus becomes expensive, hard pellicles are introduced due to the extremely low durability of soft pellicles, the optical system must be accordingly altered, and the etch resistance of resist is low; the postponement of $F_2$ lithography and the early introduction of ArF immersion lithography were advocated.

In the ArF immersion lithography, the space between the projection lens and the wafer is filled with water. Since water has a refractive index of 1.44 at 193 nm, pattern formation is possible even using a lens having a numerical aperture (NA) of 1.0 or greater. Theoretically, it is possible to increase the NA to nearly 1.44. It was initially recognized that the resolution could be degraded and the focus be shifted by a variation of water's refractive index with a temperature change. The problem of refractive index variation could be solved by controlling the water temperature within a tolerance of $1/100°$ C. while it was recognized that the impact of heat from the resist film upon light exposure drew little concern. There was a likelihood that micro-bubbles in water could be transferred to the pattern. The risk of bubble generation could be obviated by thorough deaeration of water, and the risk of bubble generation from the resist film upon light exposure is substantially nil. At the initial phase in 1980's of the immersion lithography, a method of immersing an overall stage in water was proposed. Later proposed was a partial-fill method of using a water feed/drain nozzle for introducing water only between the projection lens and the wafer so as to comply with the operation of a high-speed scanner. In principle, the immersion technique using water enabled lens design to a NA of 1 or greater. In optical systems based on traditional refractive index materials, this leads to giant lenses, which would deform by their own weight. For the design of more compact lenses, a catadioptric system was proposed, accelerating the lens design to a NA of 1.0 or greater. A combination of a lens having NA of 1.35 with strong resolution enhancement technology enables the mass-scale production of 45-nm node devices.

One recent approach for the manufacture of CMOS devices is to effect ion implantation on a substrate through a KrF resist pattern as a mask in order to form p- and n-wells in the substrate. As the resist pattern is reduced in size, a replacement by an ArF resist pattern is in progress. In order to carry out ion implantation, the substrate surface must be exposed through space areas in the resist film pattern. If a bottom antireflective coating (BARC) layer is present beneath the resist film, ions can be trapped by the BARC layer. However, if the photoresist film is patterned in the absence of the BARC layer, then standing waves are generated by substrate reflection, whereby the resist pattern after development has substantially ridged sidewalls. For the purpose of smoothening such ridges due to standing waves, it is believed effective to enhance acid diffusion by using a photoacid generator (PAG) capable of generating a low molecular weight acid which is prone to diffuse and performing PEB at higher temperature. As long as the size at which the resist film subject to ion implantation is resolved by the KrF lithography is in the range of 200 to 300 nm, it is not recognized that resolution is degraded by enhancement of acid diffusion. However, when the size at which the resist film subject to ion implantation is resolved by the ArF lithography is reduced below 200 nm, undesirably the enhancement of acid diffusion can cause degradation of resolution and increase the proximity bias.

The most traditional means for preventing generation of standing waves is a dyed resist material for forming a photoresist film which is absorptive in itself. The study on that means started from the novolak resist materials for i and g-line exposure. As the absorptive component which can be used in the ArF lithography, a study was made on the introduction of benzene ring into a base polymer and the use of an additive having benzene ring. However, it is impossible for the absorptive component to completely prevent standing waves. If the component is made more absorptive, standing waves are reduced, but the cross-sectional profile of a resist pattern can be tapered into a trapezoidal shape.

Since naphthalene ring has higher etch resistance than benzene ring, it was attempted to apply naphthalene ring to resist polymers (see Patent Documents 1 and 2). In particular, naphthalene ring and acenaphthene having a hydroxyl group have the advantage of improved adhesion to substrates over the use of only lactone ring as the adhesive group.

Patent Document 3 discloses an ion implantation-amenable resist composition comprising a methacrylate polymer having acid labile groups in blend with a cresol novolak resin, from which a pattern is formed by the KrF lithography. Despite the economic merit of using an inexpensive cresol novolak resin, this resist composition cannot be applied to the ArF lithography because of the strong absorption of the cresol novolak resin.

Patent Document 4 discloses an ion implantation-amenable resist composition comprising hydroxynaphthalene or dihydroxynaphthalene optionally substituted with an acid labile group. The addition of the monomeric component improves coverage on stepped substrates. However, since naphthalene is sublimate, a problem can arise that naphthalene component evaporates during bake and deposits on top of the hot plate.

Patent Document 5 discloses an ion implantation-amenable resist composition comprising naphthalene ring or acenaphthene. A copolymer of a naphthalene or acenaphthylene monomer, an acid labile group-containing monomer, and a monomer having a lactone adhesive group is used as the base resin. When naphthalene has a hydroxyl group, substrate adhesion is improved, but not step coverage.

Patent Document 6 discloses a thick-film resist composition comprising a blend of a polymer of t-butyl (meth)acrylate and a novolak resin. A novolak resin using dihydroxynaphthalene is exemplary. Since the acid labile group is t-butyl, the lithography performance is inferior due to a shortage of dissolution inhibition. In the ion implantation application, the resist film may have poor mask function against ion implantation.

CITATION LIST

Patent Document 1: JP 3829913
Patent Document 2: JP 3796568
Patent Document 3: U.S. Pat. No. 5,372,912
Patent Document 4: JP-A 2007-079552 (US 2007042292)
Patent Document 5: JP-A 2008-197606
Patent Document 6: JP-A 2008-249993

SUMMARY OF INVENTION

An object of the invention is to provide a positive resist composition, specifically a chemically amplified positive resist composition, which has a sufficient absorption to form a pattern on a highly reflective substrate, and is improved in pattern profile after exposure, adhesion, and step coverage; and a pattern forming process.

Seeking for the currently desired resist material which is processed by the ArF lithography to form a pattern that is compliant to the ion implantation process, the inventors have found that a positive resist composition comprising a blend of a polymer of (meth)acrylate having a cyclic acid labile group with a dihydroxynaphthalene novolak resin as base resin is effective.

To comply with exposure on a highly reflective substrate, the inventors attempted to use naphthalene ring having an adequate absorption to ArF excimer laser radiation of 193 nm wavelength. When naphthalene ring is incorporated by copolymerizing it with recurring units of methacrylate having an acid labile group, substrate reflection is suppressed and adhesion to inorganic substrates is improved, but step coverage (i.e., material embedment in recesses on a substrate) is not improved. For step coverage improvement, addition of a low molecular weight compound is effective. However, if the molecular weight of an acid labile group-containing resin is reduced, more acid diffusion occurs to detract from resolution. The addition of such a monomer as dihydroxynaphthalene leads to generation of a component which will sublimate during bake. It has been found that better results are obtained using a blend of a polymer comprising recurring units of (meth)acrylate having an acid labile group with a dihydroxynaphthalene novolak resin as base resin. The dihydroxynaphthalene novolak resin has excellent step coverage because of a broad molecular weight distribution and a low molecular weight, avoids generation of a subliming component as compared with the addition of dihydroxynaphthalene monomer, and improves substrate adhesion.

The positive resist composition is improved in resolution, step coverage and adhesion on a highly reflective stepped substrate, has high resolution and process adaptability, and forms a pattern of good profile after exposure. Because of these advantages, the composition is commercially fully acceptable and very effective as ion implantation-amenable resist material and mask pattern-forming material in the microfabrication of VLSIs.

In one aspect, the invention provides a positive resist composition comprising
a polymer comprising recurring units of (meth)acrylate having a carboxyl group substituted with an acid labile group of cyclic structure and having a weight average molecular weight of 1,000 to 500,000,
a novolak resin of dihydroxynaphthalene, and
a photoacid generator.

In a preferred embodiment, the recurring units of (meth)acrylate having a carboxyl group substituted with an acid labile group of cyclic structure have the general formula (1):

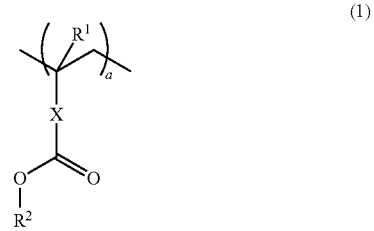

(1)

wherein $R^1$ is hydrogen or methyl, X is a single bond, a linking group of 1 to 12 carbon atoms containing at least one member selected from among an ester moiety, ether moiety and lactone ring, or a naphthylene group, and $R^2$ is an acid labile group of cyclic structure.

In a preferred embodiment, the dihydroxynaphthalene novolak resin is a resin comprising recurring units of the general formula (2):

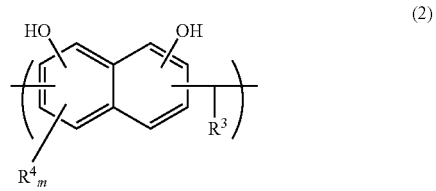

(2)

wherein $R^3$ is hydrogen, a straight, branched or cyclic $C_1$-$C_{10}$ alkyl group, $C_2$-$C_{10}$ alkenyl group or $C_6$-$C_{10}$ aryl group, which group may contain a hydroxyl, alkoxy, acyloxy, ether or sulfide radical, $R^4$ is hydrogen or a straight, branched or cyclic $C_1$-$C_6$ alkyl group, and m is an integer of 1 to 4, the resin having a weight average molecular weight of 400 to 20,000.

In another aspect, the invention provides a positive resist composition comprising a polymer comprising recurring units (a) of (meth)acrylate having a carboxyl group substituted with an acid labile group of cyclic structure, represented by the above formula (1), and recurring units (b) having an adhesive group selected from the group consisting of hydroxyl, carboxyl, lactone ring, carbonate, thiocarbonate, carbonyl, cyclic acetal, ether, ester, sulfonic acid ester, cyano, and amide groups, copolymerized therewith, wherein "a" and "b" indicative of molar ratios of the respective units are in the range: 0<a<1.0, 0<b<1.0, and 0.2≤a+b≤1.0, the polymer having a weight average molecular weight of 1,000 to 500,000, and a novolak resin of dihydroxynaphthalene having the above formula (2) as base resin, the resist composition further comprising a photoacid generator.

Typically the resist composition in either embodiment is a chemically amplified resist composition further comprising an organic solvent, and optionally, a basic compound and/or a surfactant as additive.

The invention also provides a pattern forming process comprising the steps of coating the positive resist composition defined above onto a substrate, baking, exposing to high-energy radiation, and developing with a developer to form a resist pattern. Typically, the high-energy radiation is ArF excimer laser.

After the step of developing with a developer to form a resist pattern, ion implantation into the substrate may be carried out.

The positive resist composition, specifically chemically amplified positive resist composition may be applied not only to the lithography for forming semiconductor circuits, but also to the fabrication of mask circuit patterns, micro-machines, and thin-film magnetic head circuits.

Advantageous Effects of Invention

The positive resist composition is improved in resolution, step coverage and adhesion on a highly reflective stepped substrate, has high resolution, and forms a pattern of good profile and minimal edge roughness through exposure and development. It is best suited as a micropatterning material for the fabrication of VLSIs and photomasks by EB imaging.

DESCRIPTION OF EMBODIMENTS

The terms "a" and "an" herein do not denote a limitation of quantity, but rather denote the presence of at least one of the referenced item. "Optional" or "optionally" means that the subsequently described event or circumstance may or may not occur, and that the description includes instances where the event occurs and instances where it does not. As used herein, the notation ($C_n$-$C_m$) means a group containing from n to m carbon atoms per group.

The abbreviations and acronyms have the following meaning.

Mw: weight average molecular weight
Mn: number average molecular weight
Mw/Mn: molecular weight distribution or dispersity
GPC: gel permeation chromatography
PEB: post-exposure baking
(Meth)acrylate Polymer The positive resist composition is defined as comprising a polymer comprising recurring units of (meth)acrylate having a carboxyl group substituted with an acid labile group of cyclic structure (exactly stated, a carboxyl group whose hydrogen is replaced by an acid labile group of cyclic structure) as the base resin. Preferably, the recurring unit has the general formula (1):

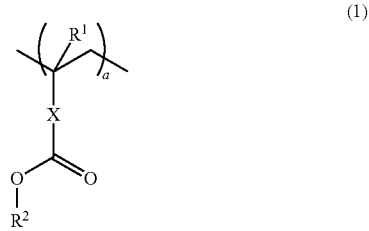

wherein $R^2$ is hydrogen or methyl, X is a single bond, a linking group of 1 to 12 carbon atoms containing one or more selected from among an ester (—COO—) moiety, ether (—O—) moiety and lactone ring, or a naphthylene group, and $R^2$ is an acid labile group of cyclic structure. For the sake of convenience, the polymer comprising recurring units of (meth)acrylate as represented by formula (1) is sometimes referred to as "(meth)acrylate polymer."

The recurring unit (a) having an acid labile group represented by formula (1) are derived from a monomer Ma having the following general formula:

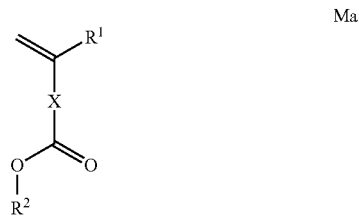

wherein $R^1$, $R^2$, and X are as defined above.

X stands for a linking group of 1 to 12 carbon atoms, examples of which include straight, branched or cyclic alkylene groups, arylene groups such as phenylene and naphthylene, and combinations of these alkylene and arylene groups, i.e., aralkylene groups. X also stands for a linking group of 1 to 12 carbon atoms having lactone ring, with an example thereof being shown below.

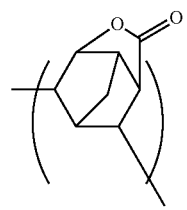

Examples of the monomer Ma from which the recurring unit (a) is derived are shown below.

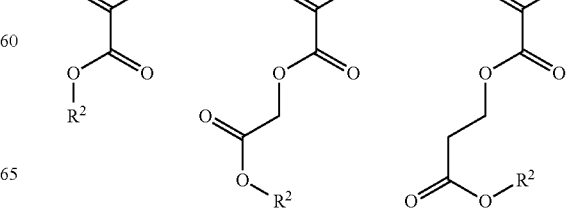

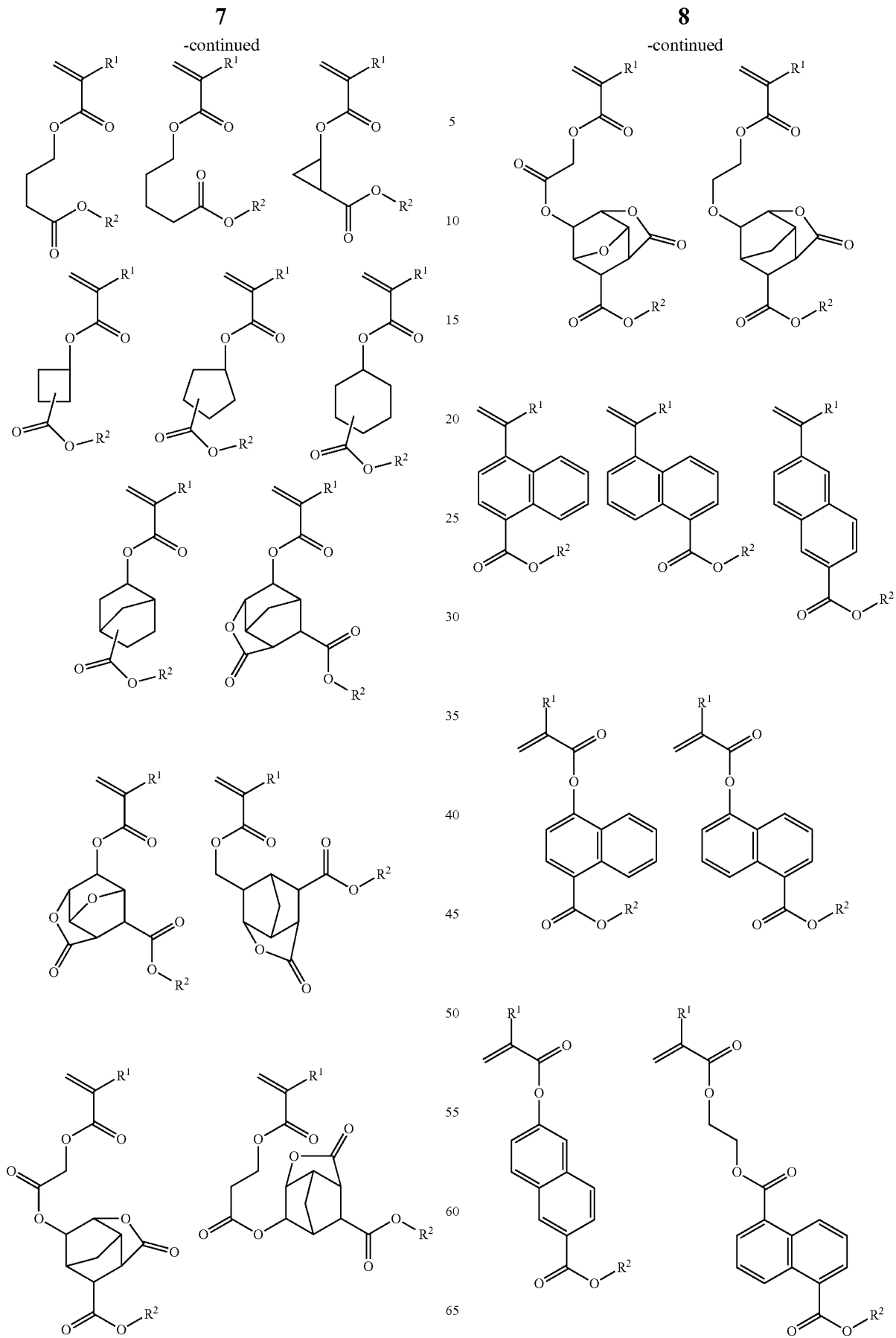

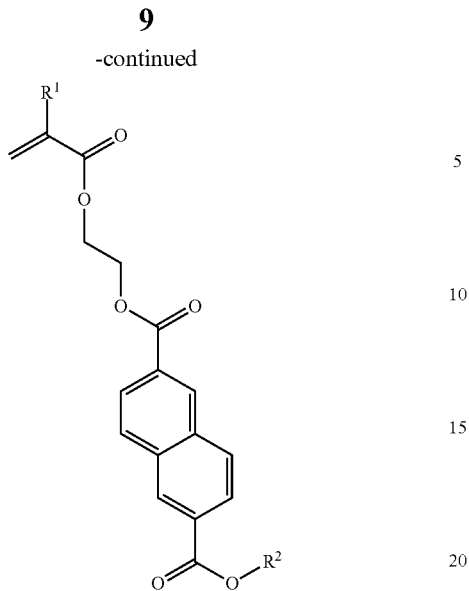

The acid labile group represented by $R^2$ in formula (1) may be selected from a variety of such groups while it may be the same or different among units. The preferred acid labile group has the formula (A-1).

(A-1)

Herein $R^{34}$ is a straight, branched or cyclic $C_1$-$C_{16}$ alkyl group, $C_6$-$C_{10}$ aryl group, or $C_2$-$C_{16}$ alkenyl group, which may contain an oxygen or sulfur atom. $R^{35}$ and $R^{36}$ bond together to form a non-aromatic ring with the carbon atom to which they are attached, the ring having 3 to 20 carbon atoms, preferably 4 to 16 carbon atoms.

The group of formula (A-1) may be a tertiary alkyl group, examples of which include groups of the following formulae (A-1)-1 to (A-1)-10.

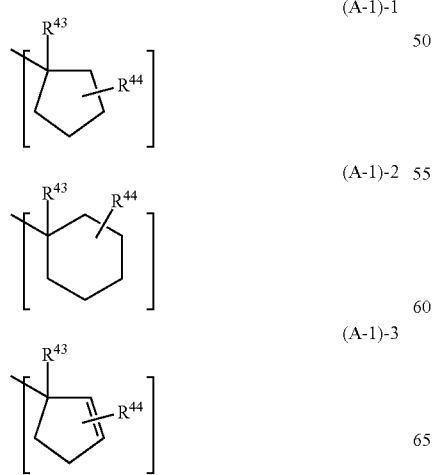

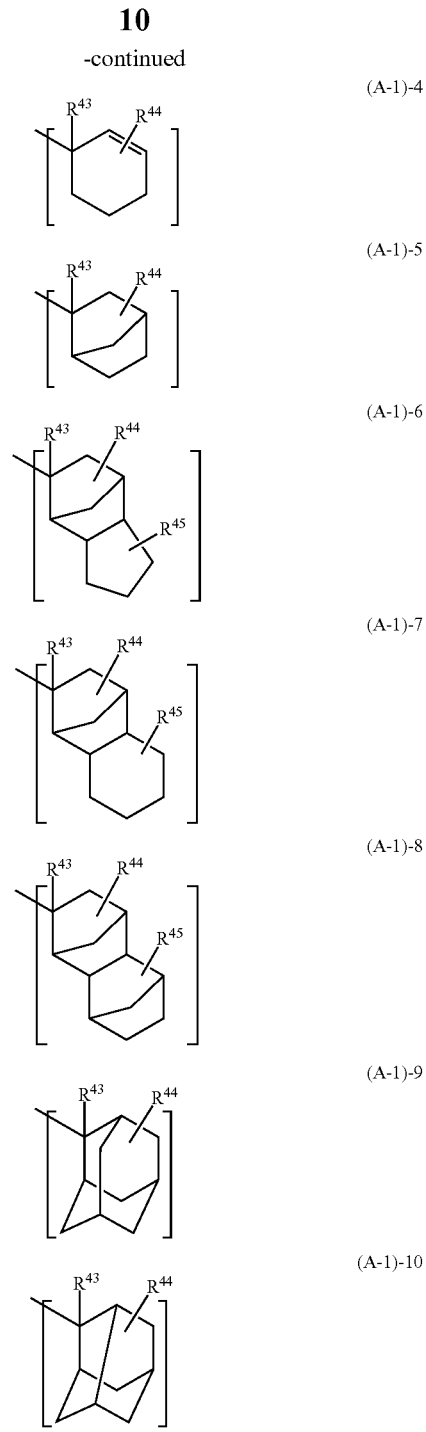

Groups of the following formulae (A-1)-11 to (A-1)-17 are also useful as $R^2$.

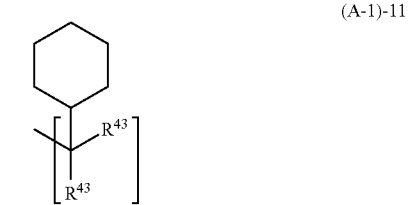

(A-1)-12
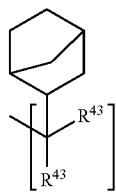

(A-1)-13
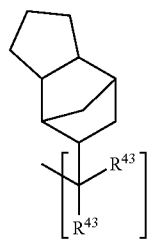

(A-1)-14
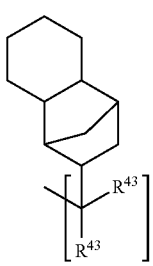

(A-1)-15
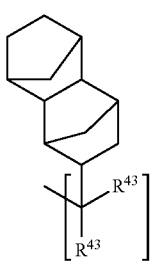

(A-1)-16
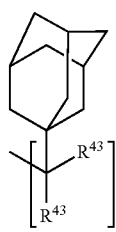

(A-1)-17
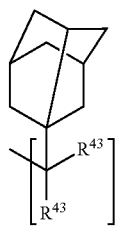

In formulae (A-1)-1 to (A-1)-17, $R^{43}$ is each independently a straight, branched or cyclic $C_1$-$C_8$ alkyl group or a $C_6$-$C_{20}$ aryl group such as phenyl or naphthylene. $R^{44}$ and $R^{45}$ are each independently hydrogen or a straight, branched or cyclic $C_1$-$C_{20}$ alkyl group.

Of the recurring units (a) having an acid labile group of formula (A-1), recurring units of (meth)acrylate having an exo-form structure represented by the formula (A-1)-21 are preferred.

(A-1)-21
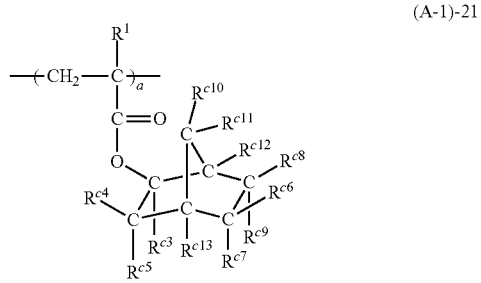

Herein, $R^1$ is as defined above; $R^{c3}$ is a straight, branched or cyclic $C_1$-$C_8$ alkyl group or an optionally substituted $C_6$-$C_{20}$ aryl group; $R^{c4}$ to $R^{c9}$, $R^{c12}$ and $R^{c13}$ are each independently hydrogen or a monovalent $C_1$-$C_{15}$ hydrocarbon group which may contain a heteroatom; and $R^{c10}$ and $R^{c11}$ are independently hydrogen or a monovalent $C_1$-$C_{15}$ hydrocarbon group which may contain a heteroatom. Alternatively, a pair of $R^{c4}$ and $R^{c5}$, $R^{c6}$ and $R^{c8}$, $R^{c6}$ and $R^{c9}$, $R^{c7}$ and $R^{c9}$, $R^{c7}$ and $R^{c13}$, $R^{c8}$ and $R^{c12}$, $R^{c10}$ and $R^{c11}$, or $R^{c11}$ and $R^{c12}$ may bond together to form a ring, and in this case, each group participating in ring formation is a divalent $C_1$-$C_m$ hydrocarbon group which may contain a heteroatom. Also, a pair of $R^{c4}$ and $R^{c13}$, $R^{c10}$ and $R^{c13}$, or $R^{c6}$ and $R^{c8}$ which are attached to vicinal carbon atoms may bond together directly to form a double bond. The formula also represents an enantiomer.

The ester form monomers from which recurring units having an exo-form structure represented by formula (A-1)-21 are derived are described in U.S. Pat. No. 6,448,420 (JP-A 2000-327633). Exemplary monomers are shown below, but not limited thereto.

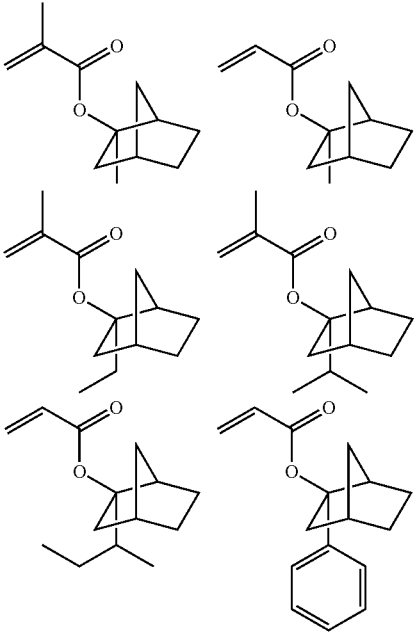

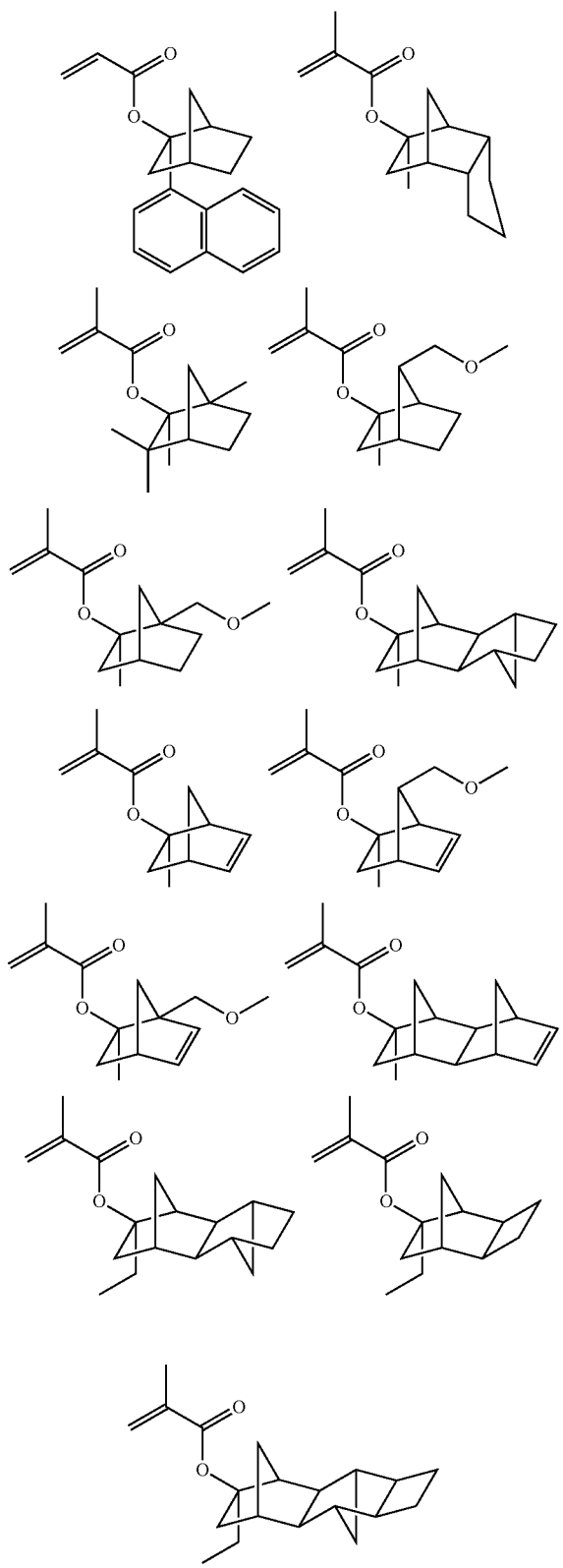

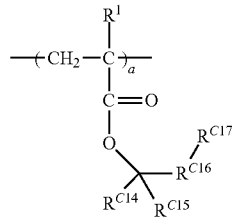
(A-1)-22

Herein, $R^1$ is as defined above. $R^{c14}$ and $R^{c15}$ are each independently a straight, branched or cyclic, monovalent $C_1$-$C_{10}$ hydrocarbon group. $R^{c14}$ and $R^{c15}$, taken together, may form an aliphatic hydrocarbon ring with the carbon atom to which they are attached. $R^{c16}$ is a divalent group selected from furandiyl, tetrahydrofurandiyl and oxanorbornanediyl. $R^{c17}$ is hydrogen or a straight, branched or cyclic, monovalent $C_1$-$C_{10}$ hydrocarbon group which may contain a heteroatom.

Examples of the monomer from which the recurring unit substituted with an acid labile group having furandiyl, tetrahydrofurandiyl or oxanorbornanediyl is derived are shown below. Note that Me is methyl and Ac is acetyl.

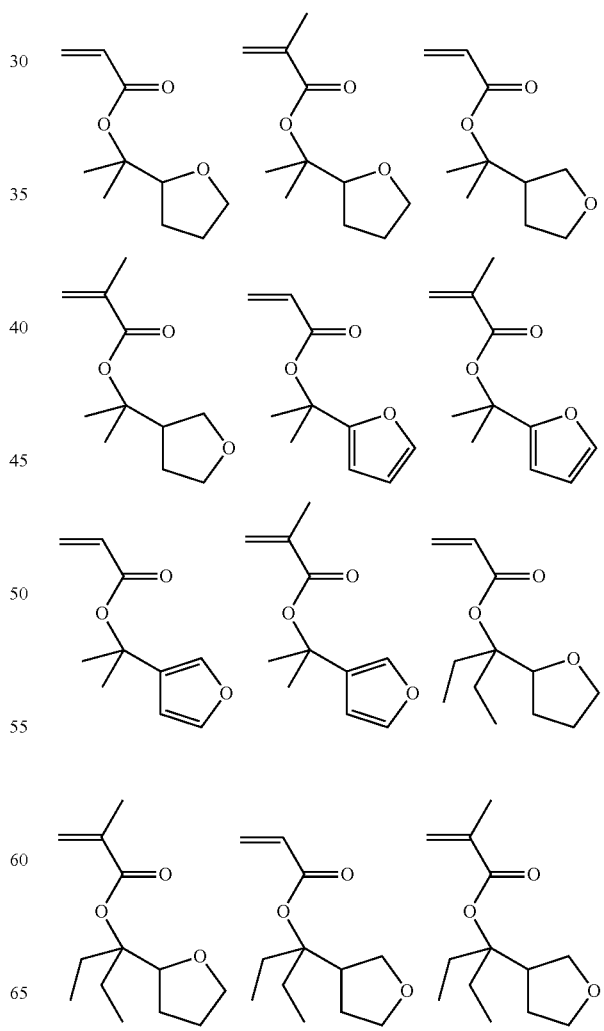

Also included in the recurring units (a) having an acid labile group are recurring units of (meth)acrylate having a furandiyl, tetrahydrofurandiyl or oxanorbornanediyl group as represented by the following formula (A-1)-22.

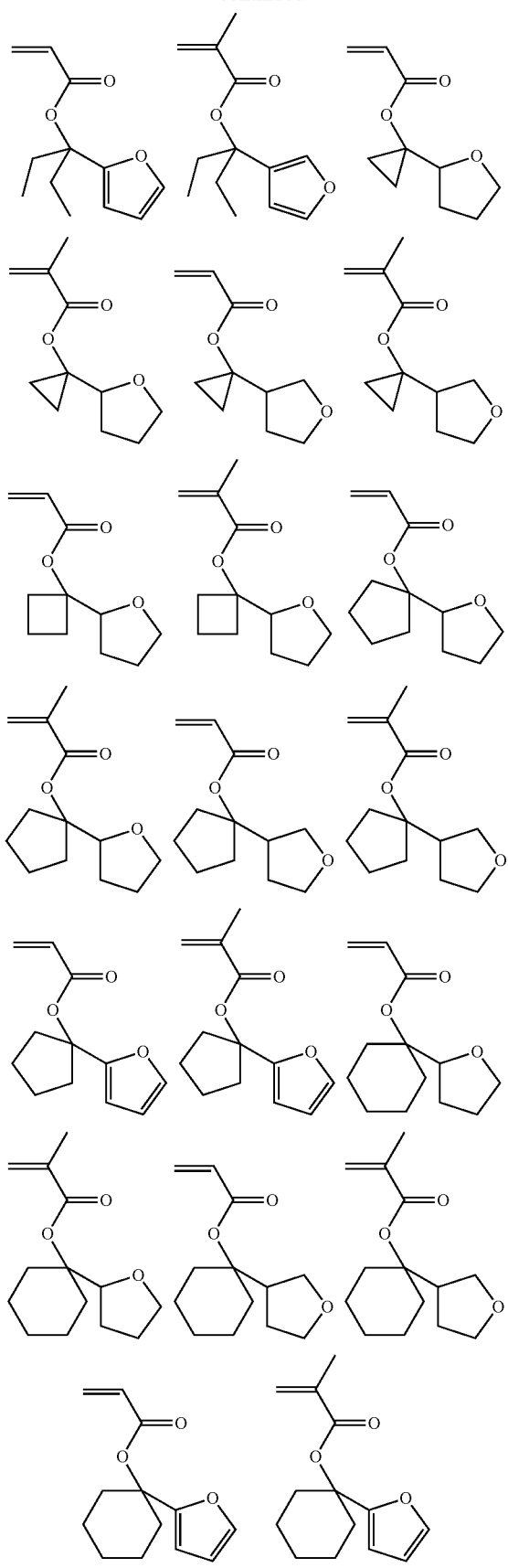
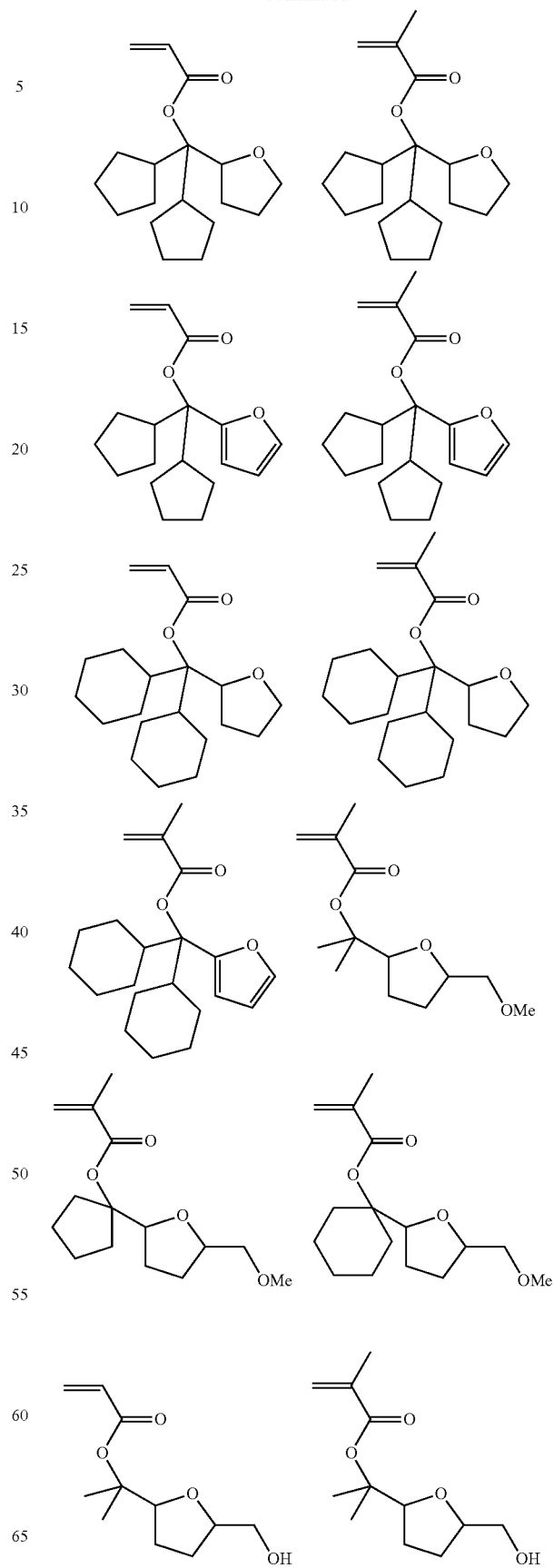

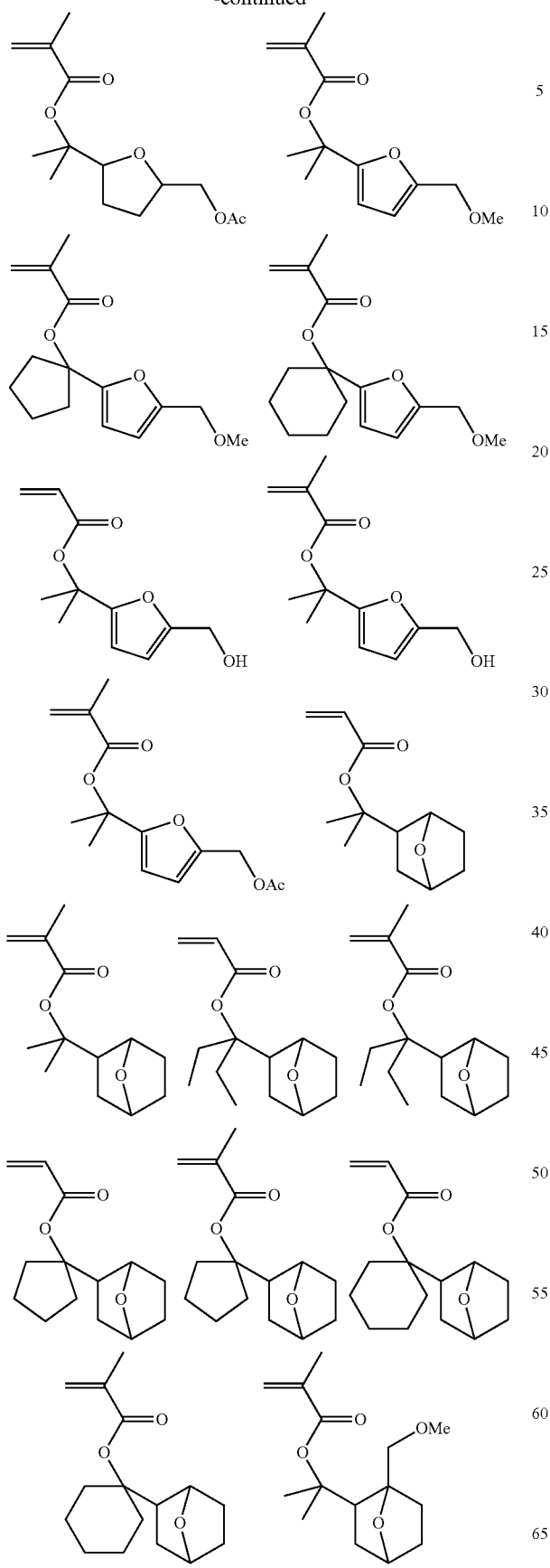
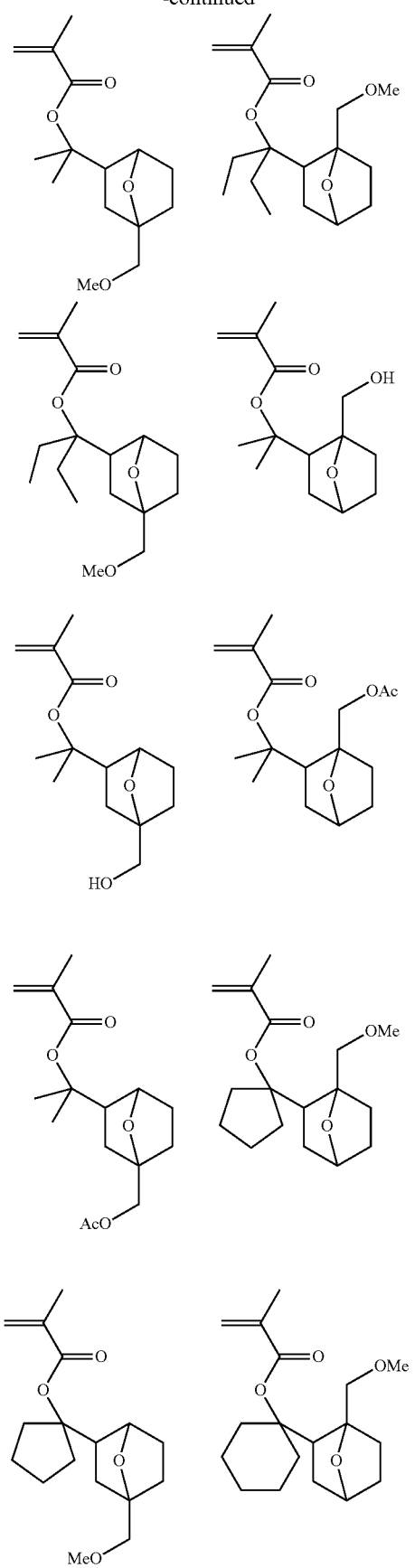

-continued

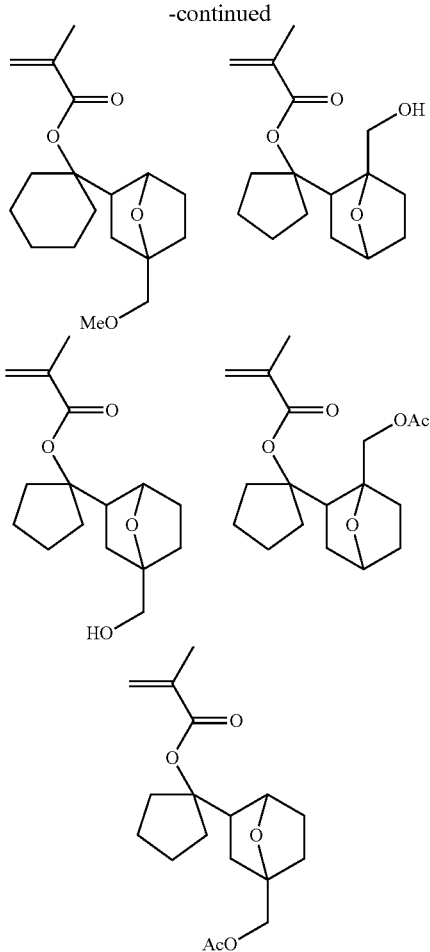

In recurring unit (a), the hydrogen atom of a carboxyl group may be replaced by an acid labile group having the general formula (A-1)-23.

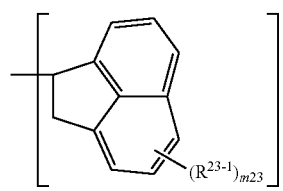

(A-1)-23

Herein, $R^{23-1}$ is hydrogen, or a $C_1$-$C_4$ alkyl, alkoxy, alkanoyl or alkoxycarbonyl group, and m23 is 0 or an integer of 1 to 4.

Examples of the monomer having a carboxyl group substituted with an acid labile group of formula (A-1)-23 are shown below.

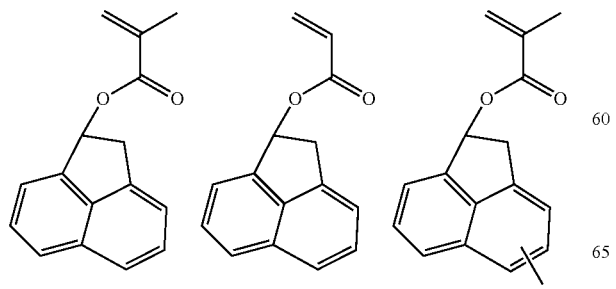

-continued

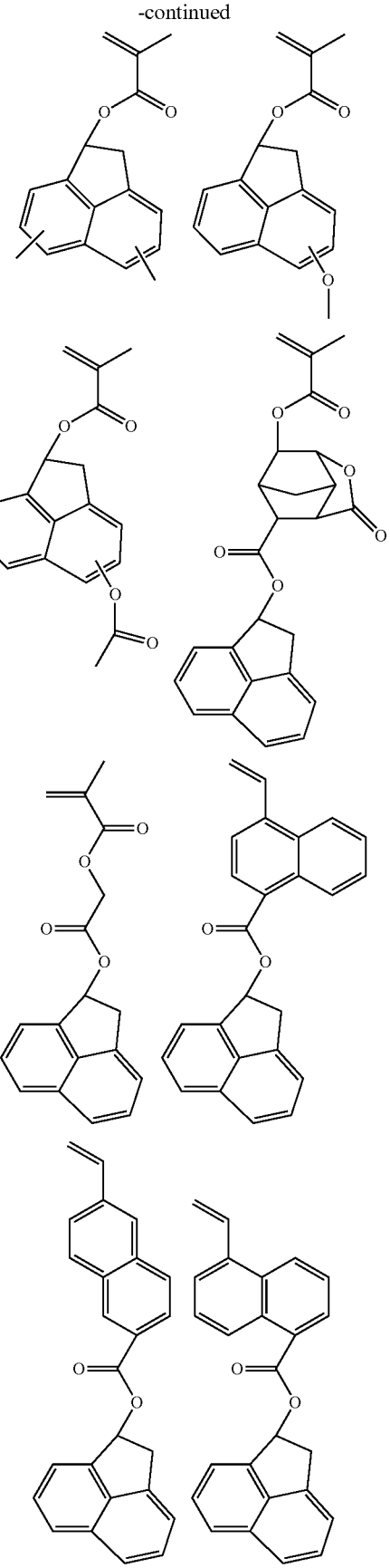

In a preferred embodiment, the polymer comprising recurring units (a) having formula (1) and serving as base resin may have further copolymerized therein recurring units (b) having an adhesive group selected from among hydroxyl, carboxyl, lactone ring, carbonate, thiocarbonate, carbonyl, cyclic acetal, ether, ester, sulfonic acid ester, cyano, and amide groups wherein "a" and "b" indicative of molar ratios of the respective units are in the range: 0<a<1.0, 0<b<1.0, and 0.2≤a+b≤1.0. The polymer has a weight average molecular weight of 1,000 to 500,000.

Examples of the monomer from which recurring unit (b) having an adhesive group selected from among hydroxyl, carboxyl, lactone ring, carbonate, thiocarbonate, carbonyl, cyclic acetal, ether, ester, sulfonic acid ester, cyano, and amide groups is derived are shown below.

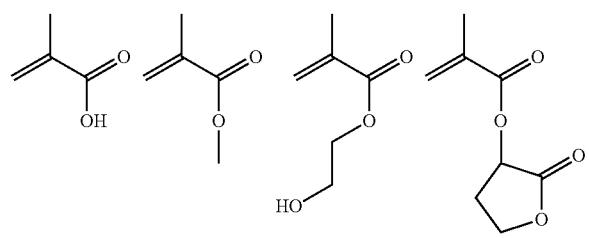

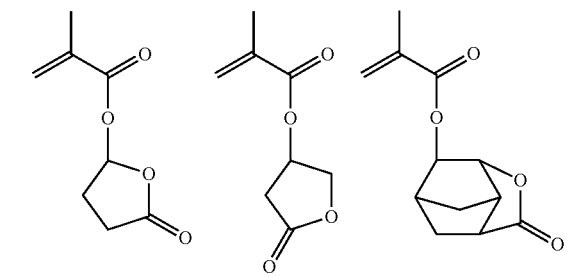

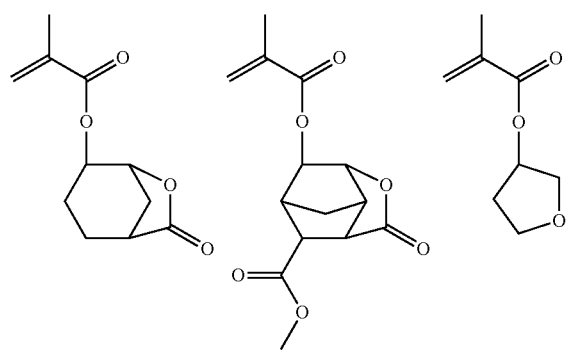

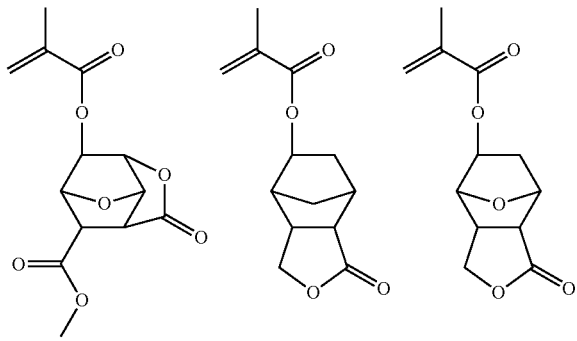

-continued

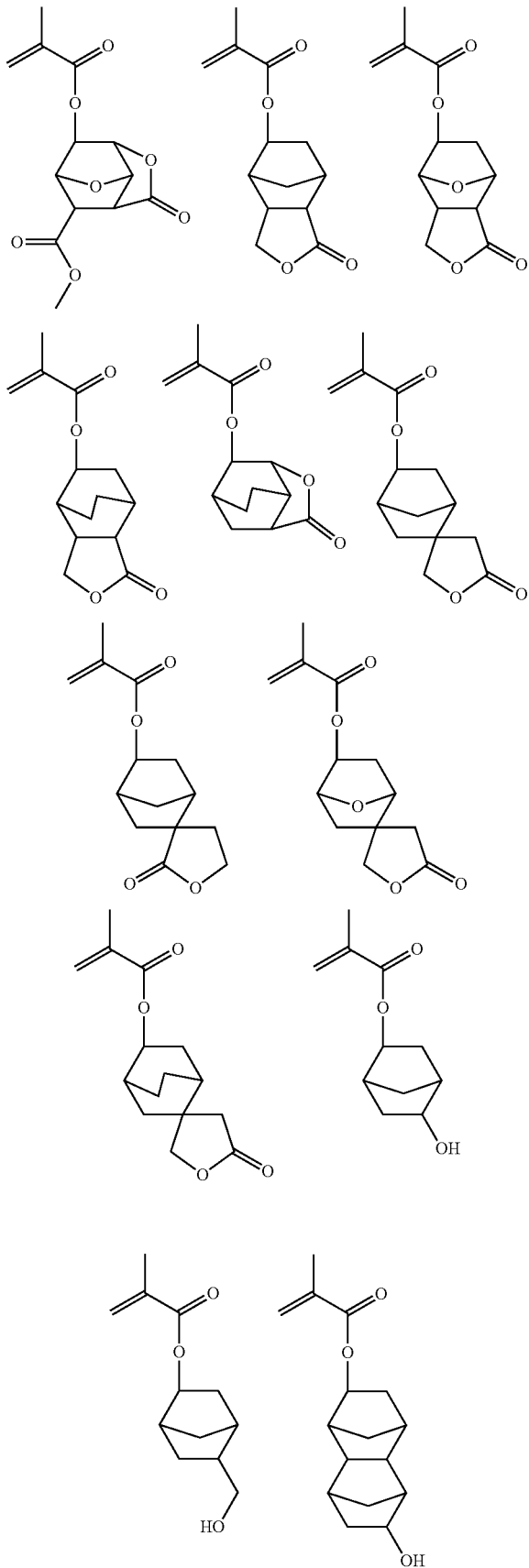

23
-continued

24
-continued

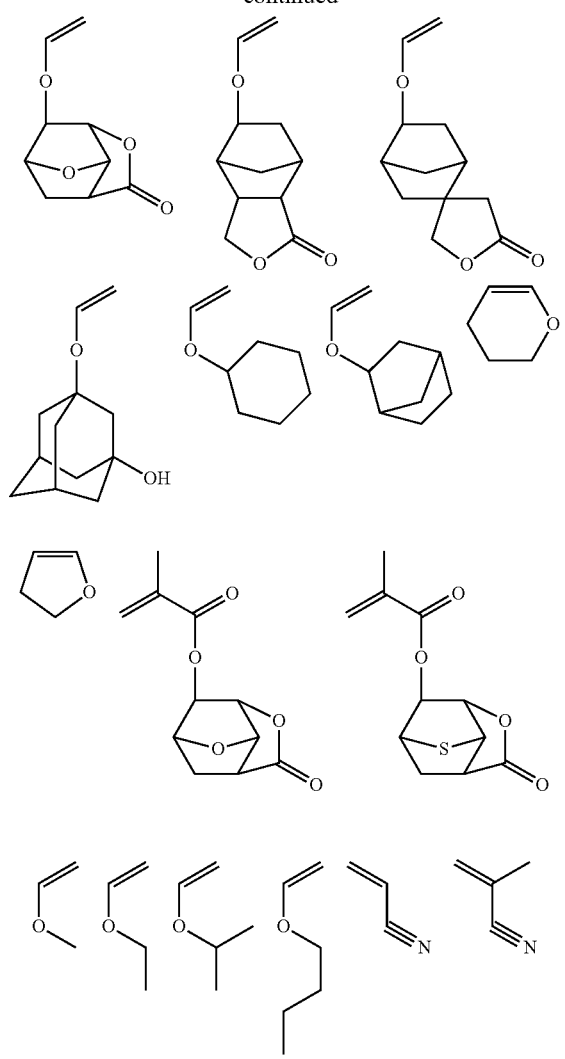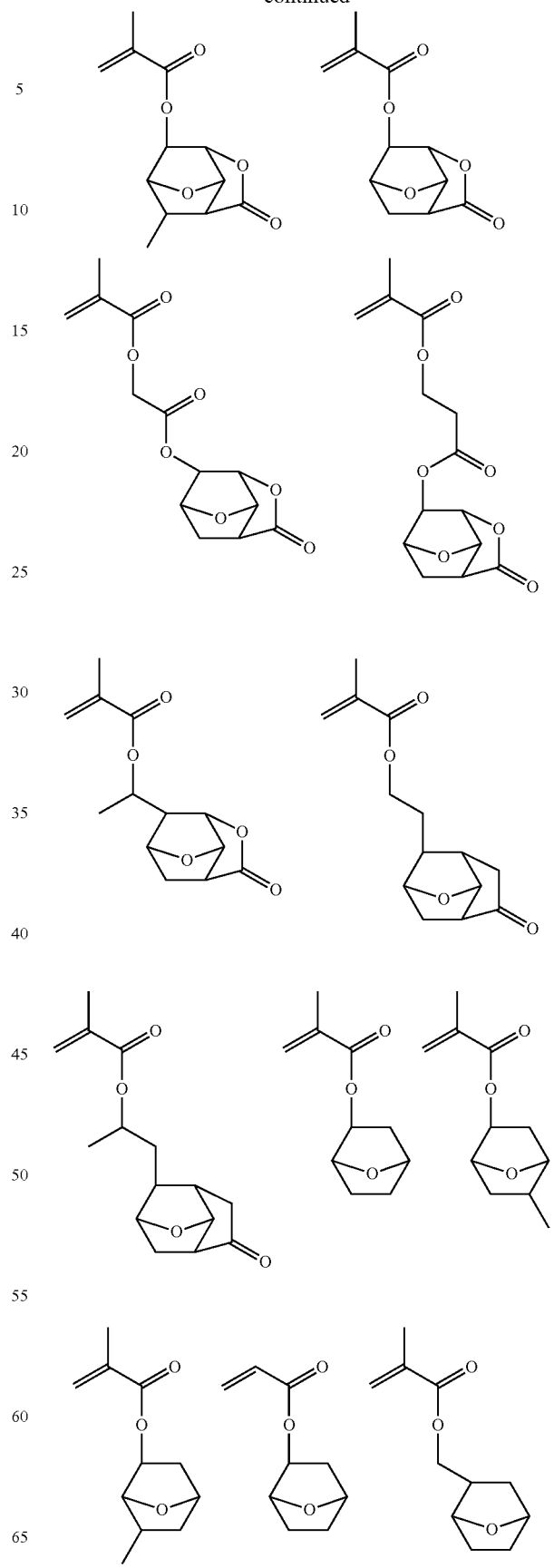

27
-continued
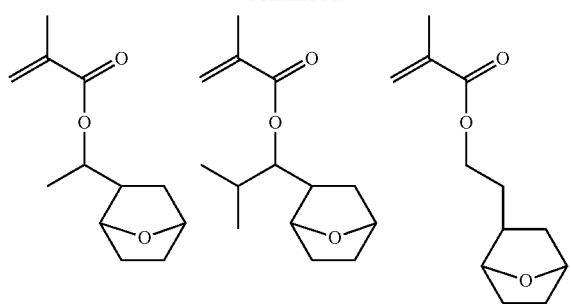
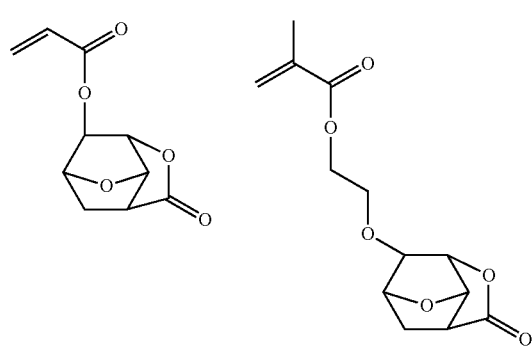
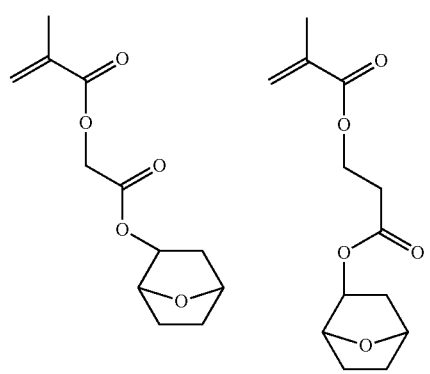
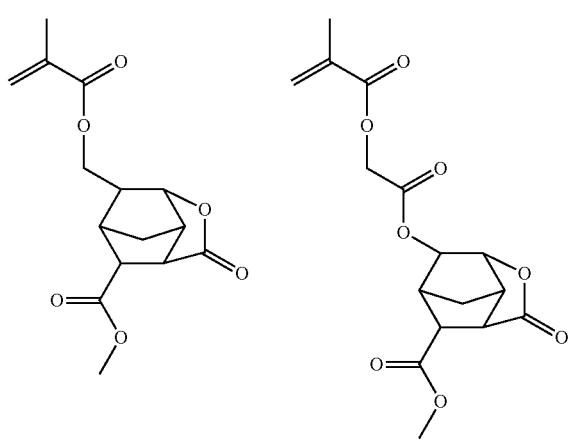
28
-continued
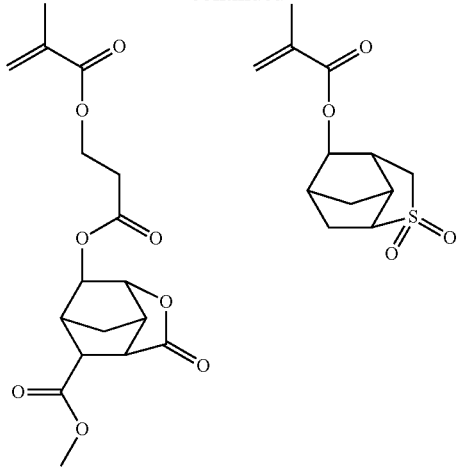
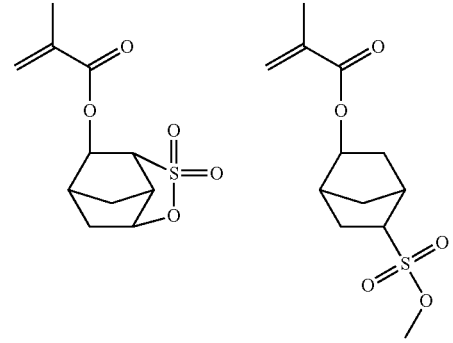
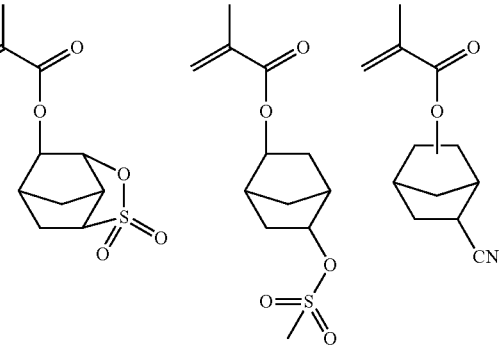
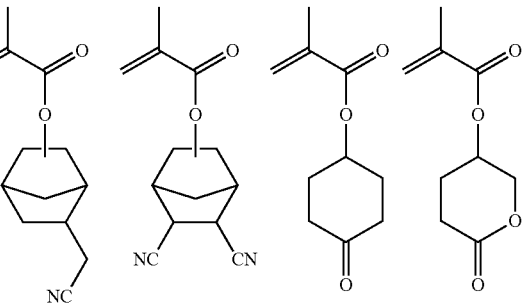

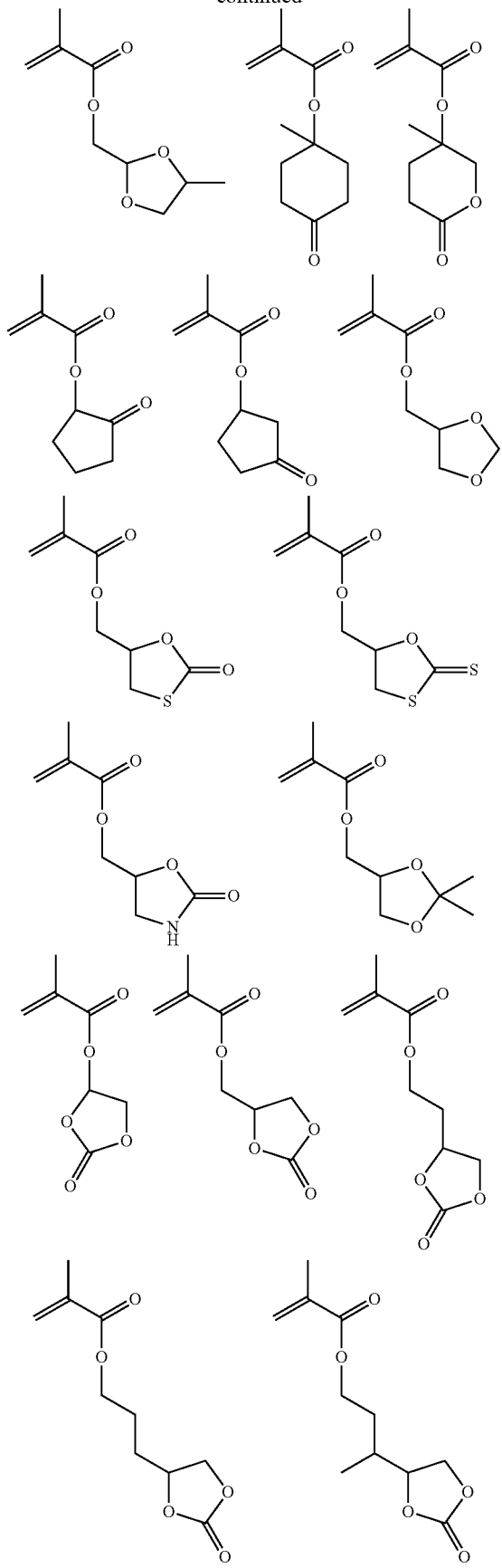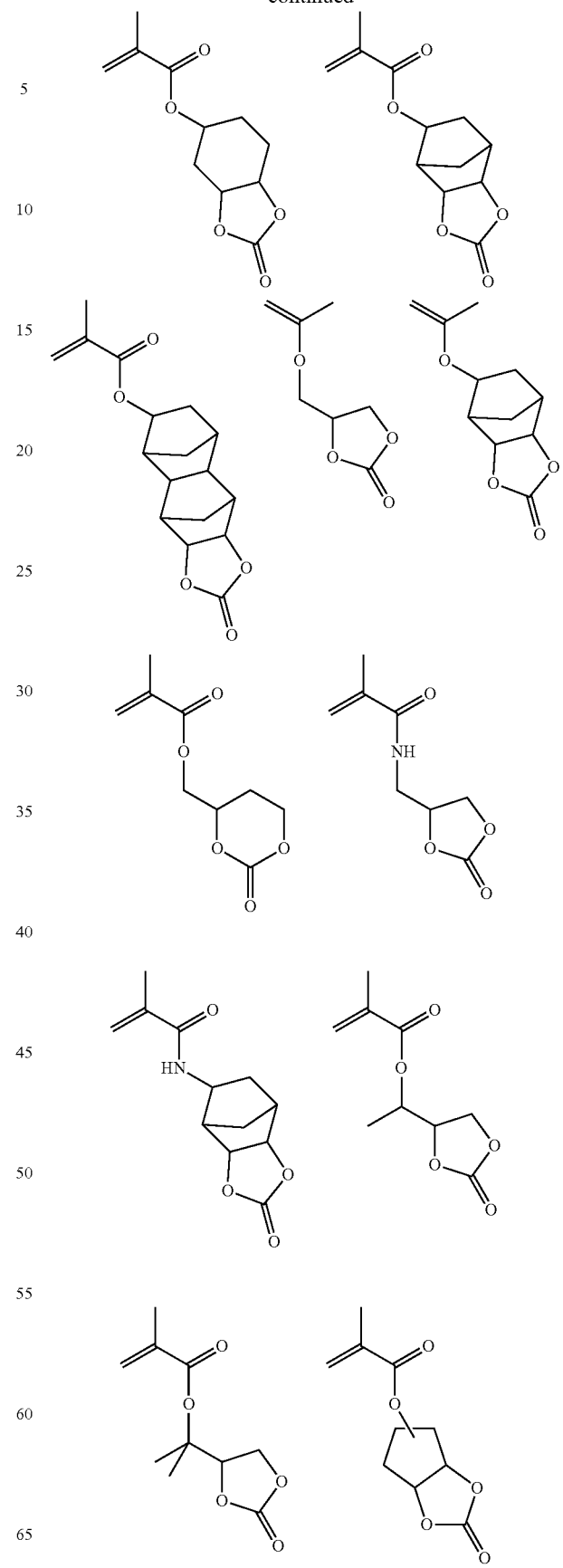

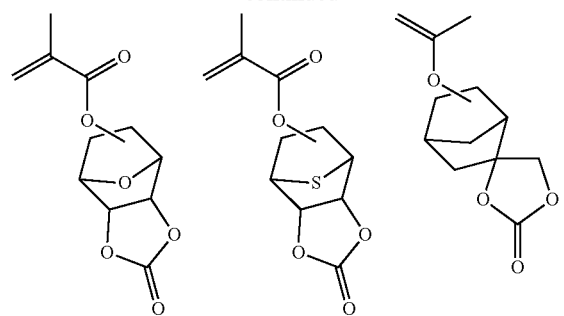
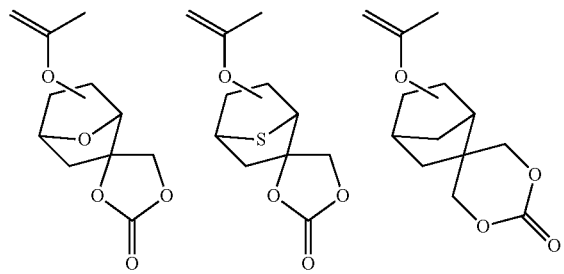
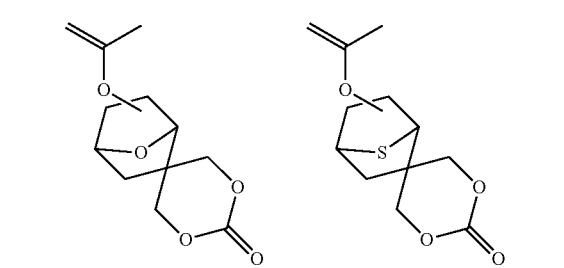
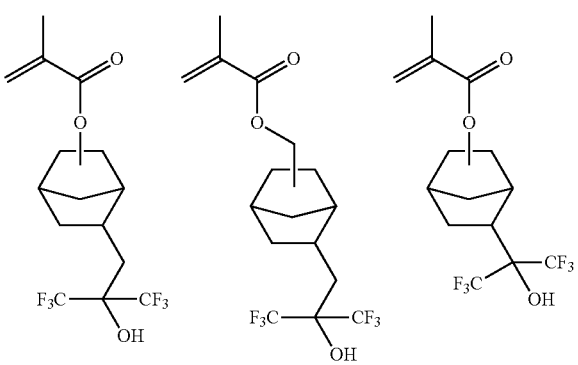
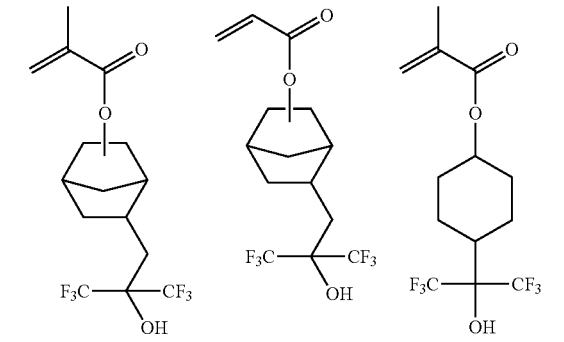
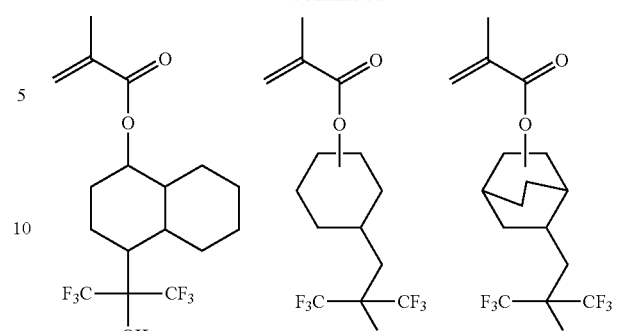
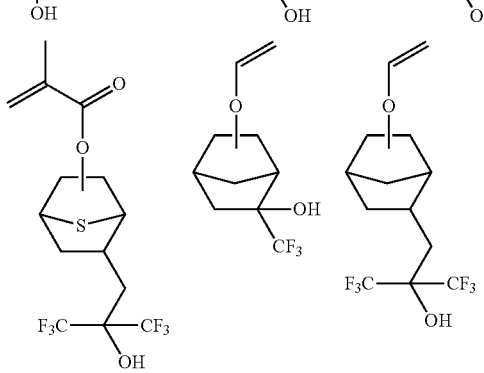
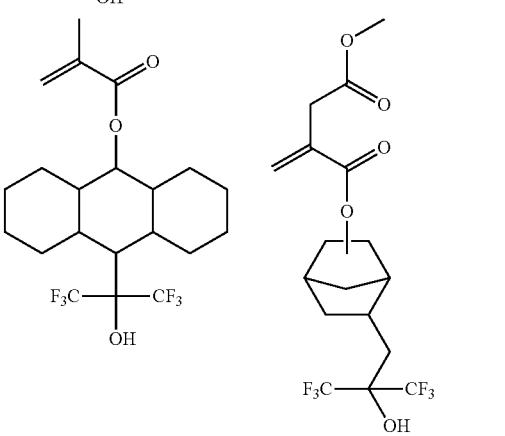
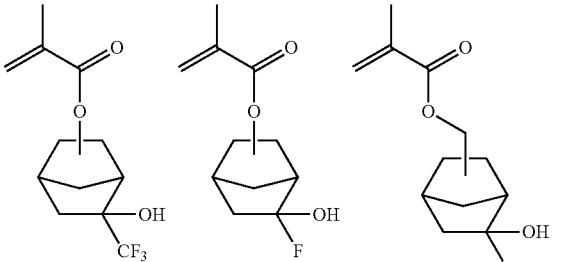
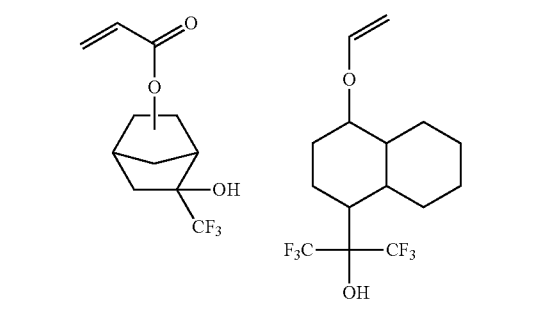

33
-continued
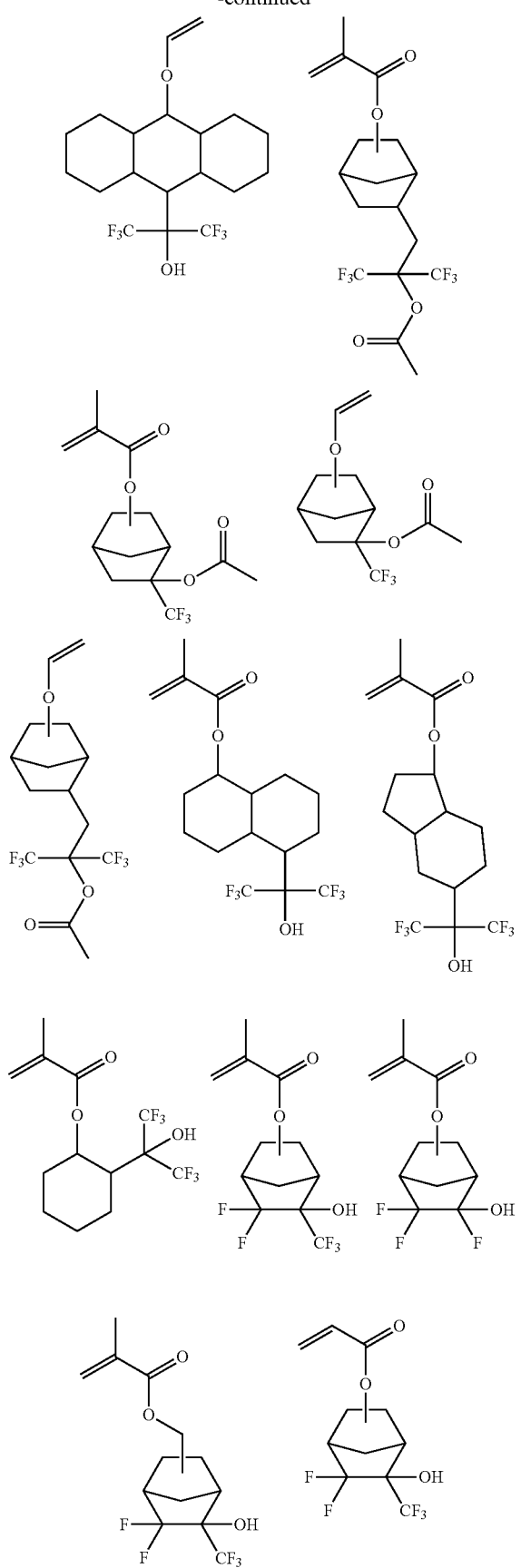
34
-continued
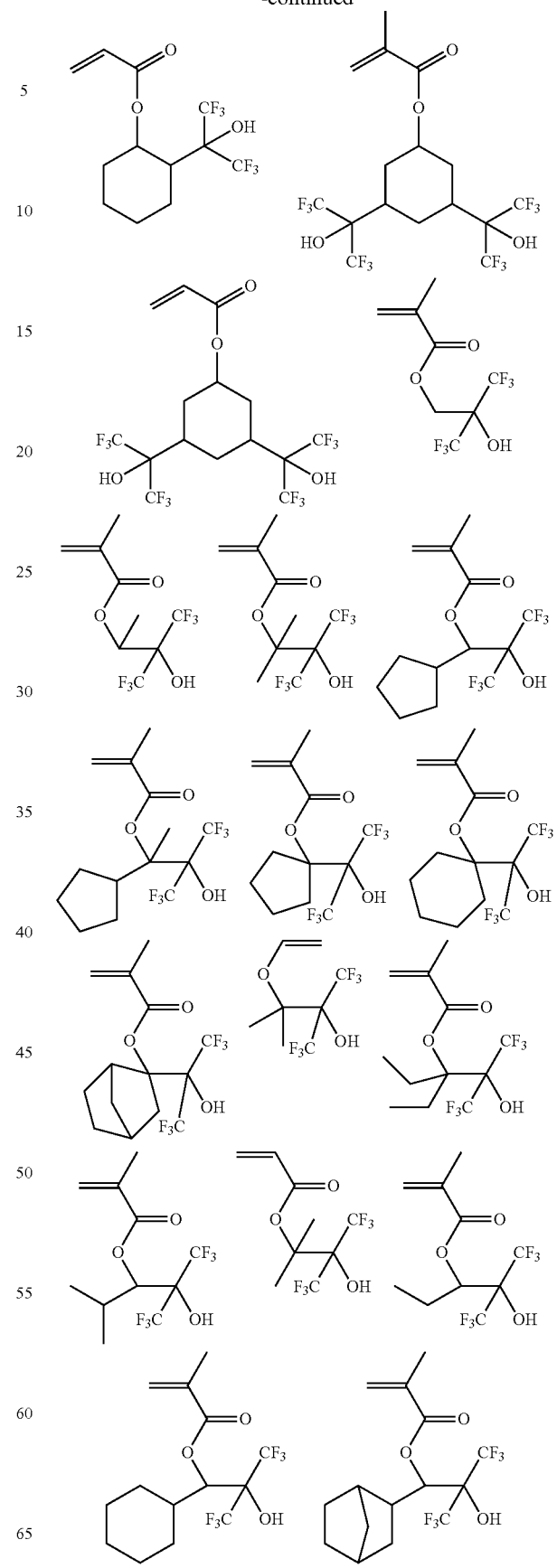

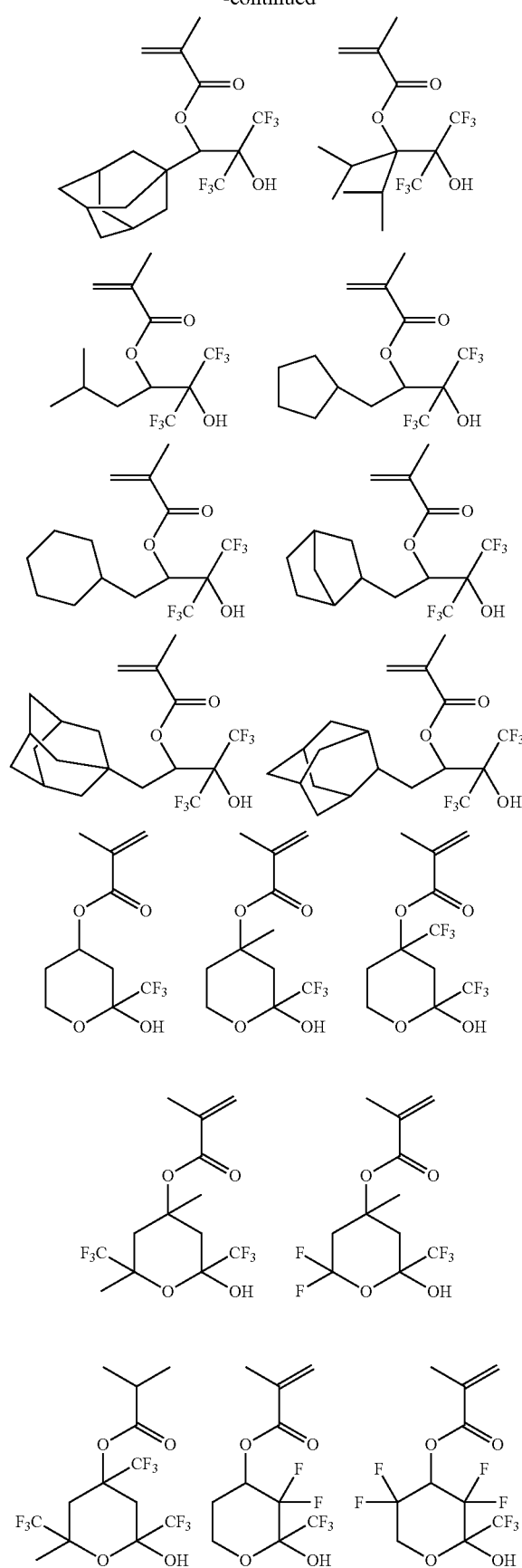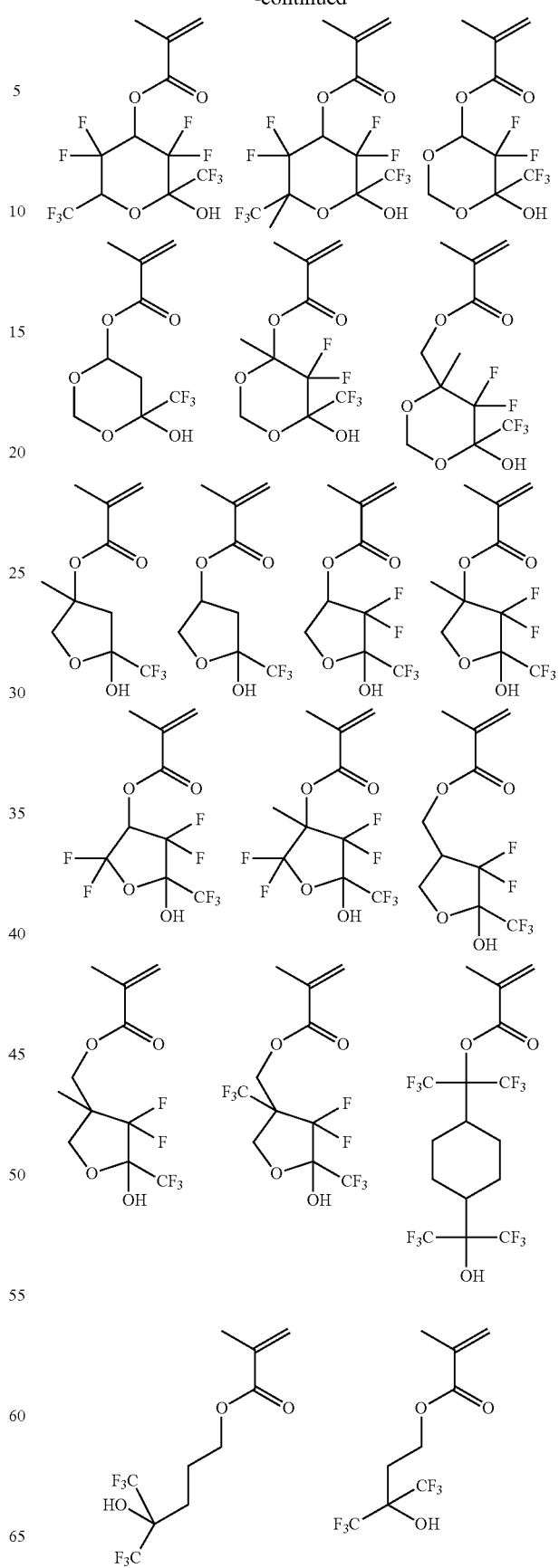

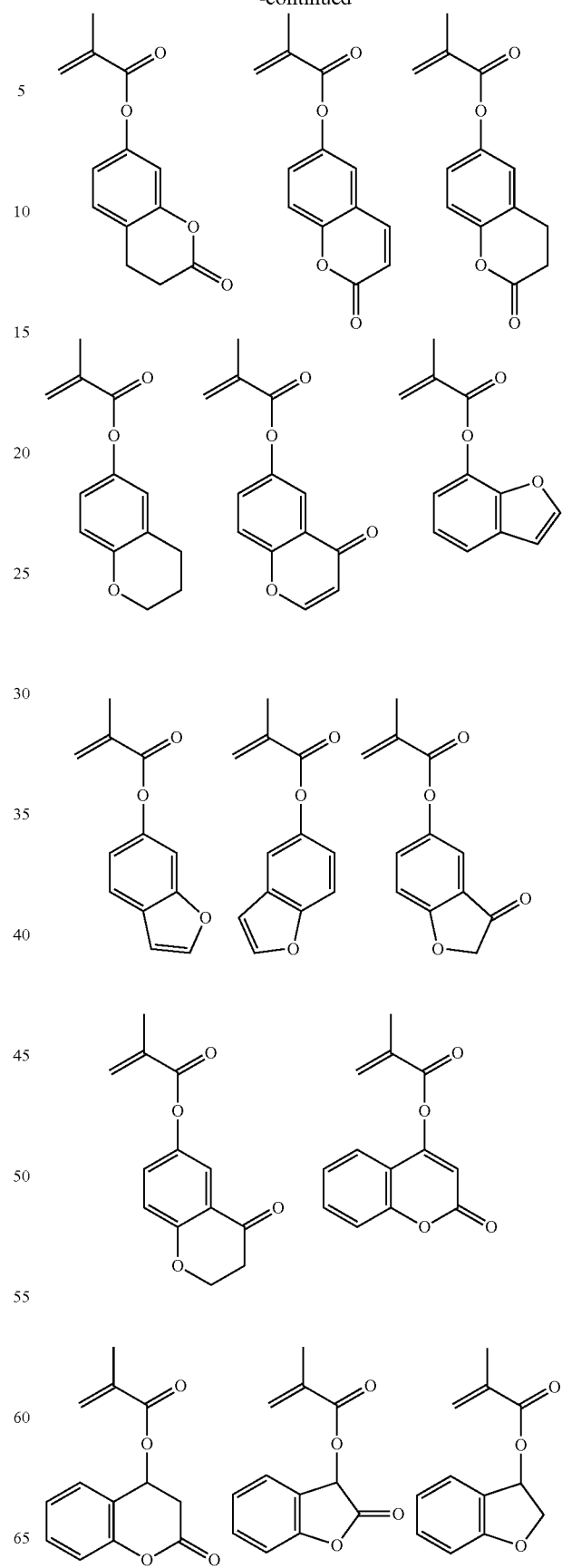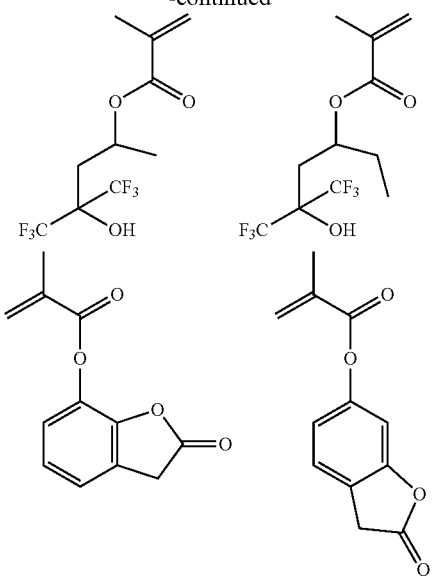

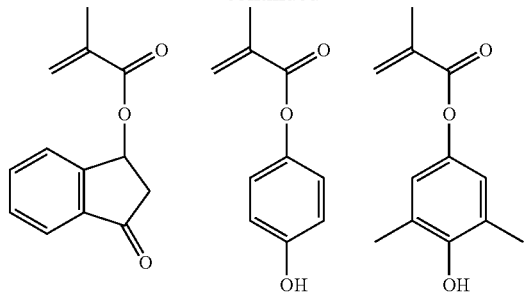
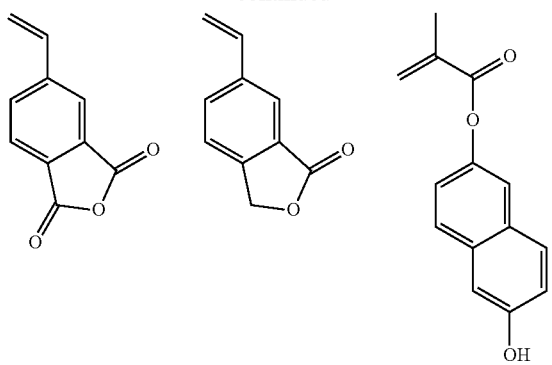
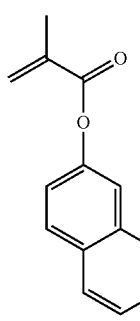
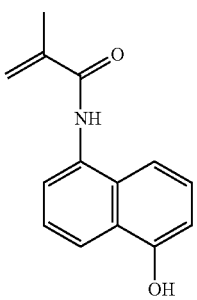
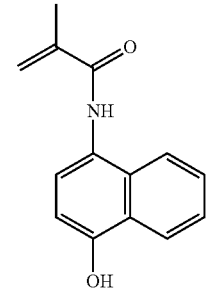
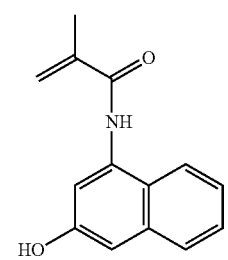

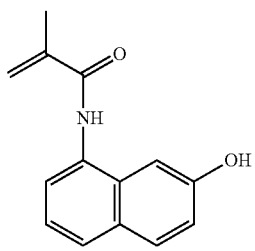
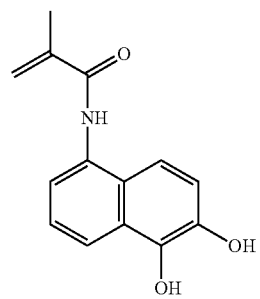

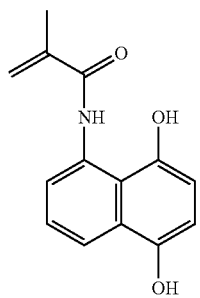
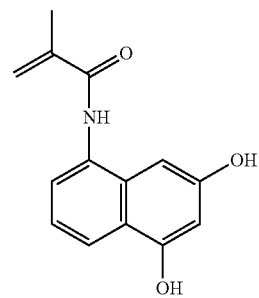

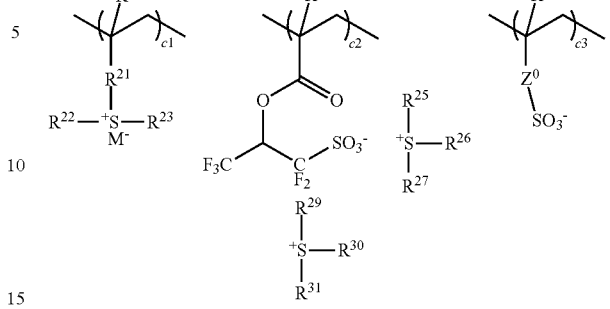
(3)

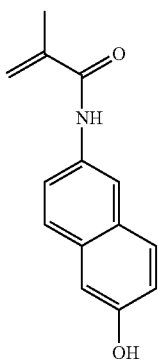

On use of a monomer having a hydroxyl group, prior to polymerization, the hydroxyl group may be replaced by an acetal group which is readily deprotected with an acid, such as ethoxyethoxy, and polymerization be followed by deprotection with weak acid and water. Alternatively, the hydroxyl group may be replaced by an acetyl, formyl, pivaloyl or similar group, and polymerization be followed by alkaline hydrolysis.

In addition to the recurring units (a) having an acid labile group and the recurring units (b) having an adhesive group, the polymer may have further copolymerized therein recurring units (c) having a sulfonium salt (c1), (c2) or (c3) represented by the general formula (3). JP-A H04-230645, JP-A 2005-084365, and JP-A 2006-045311 disclose sulfonium and iodonium salts of polymerizable olefin capable of generating a specific sulfonic acid. JP-A 2006-178317 discloses a sulfonium salt having sulfonic acid directly attached to the main chain.

Herein $R^{20}$, $R^{24}$, and $R^{28}$ each are hydrogen or methyl. $R^{22}$ is a single bond, phenylene group, —O—R— or —C(=O)—Y—R— wherein Y is an oxygen atom or NH, and R is a straight, branched or cyclic $C_1$-$C_6$ alkylene, alkenylene or phenylene group, which may contain a carbonyl (—CO—), ester (—COO—), ether (—O—) or hydroxyl radical. $R^{22}$, $R^{23}$, $R^{25}$, $R^{26}$, $R^{27}$, $R^{29}$, $R^{30}$, and $R^{31}$ are each independently a straight, branched or cyclic $C_1$-$C_{12}$ alkyl group which may contain a carbonyl, ester or ether radical, or a $C_6$-$C_{12}$ aryl group, $C_7$-$C_{20}$ aralkyl group or thiophenyl group. $Z^0$ is a single bond, methylene, ethylene, phenylene, fluorinated phenylene, —O—$R^{32}$—, or —C(=O)—$Z^1$—$R^{32}$— wherein $Z^1$ is an oxygen atom or NH, and $R^{32}$ is a straight, branched or cyclic $C_1$-$C_6$ alkylene, alkenylene or phenylene group, which may contain a carbonyl, ester, ether or hydroxy radical. M$^-$ is a non-nucleophilic counter ion. The subscripts c1, c2 and c3 are numbers in the range: $0 \le c1 \le 0.5$, $0 \le c2 \le 0.5$, $0 \le c3 \le 0.5$, and $0 \le c1+c2+c3 \le 0.5$.

The attachment of an acid generator to the polymer main chain is effective in restraining acid diffusion, thereby preventing a drop of resolution due to blur by acid diffusion. Also edge roughness (LER or LWR) is improved since the acid generator is uniformly dispersed.

Examples of the non-nucleophilic counter ion represented by M$^-$ include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkylsulfonate ions such as mesylate and butanesulfonate; imide acids such as bis(trifluoromethylsulfonyl)imide, bis(perfluoroethylsulfonyl)imide, and bis(perfluorobutylsulfonyl)imide; and methide acids such as tris(trifluoromethylsulfonyl)methide and tris(perfluoroethylsulfonyl)methide.

Other non-nucleophilic counter ions include sulfonates having fluorine substituted at α-position as represented by the general formula (K-1) and sulfonates having fluorine substituted at α- and β-positions as represented by the general formula (K-2).

$$R^{102}-F_2C-SO_3^-  \quad (K-1)$$

$$R^{103}-O-\underset{F_3C}{\overset{}{C}}H-F_2C-SO_3^- \quad (K-2)$$

In formula (K-1), $R^{102}$ is hydrogen, or a straight, branched or cyclic $C_1$-$C_{20}$ alkyl group, $C_2$-$C_{20}$ alkenyl group, or $C_6$-$C_{20}$ aryl group, which may have an ether, ester, carbonyl radical, lactone ring or fluorine. In formula (K-2), $R^{103}$ is hydrogen, or a straight, branched or cyclic $C_1$-$C_{30}$ alkyl or acyl group, $C_2$-$C_{20}$ alkenyl group, or $C_6$-$C_{20}$ aryl or aryloxy group, which may have an ether, ester, carbonyl radical or lactone ring.

In a preferred embodiment, the polymer may have further copolymerized therein recurring units (d) of indene (d1), acenaphthylene (d2), chromone (d3), coumarin (d4), and norbornadiene (d5), or derivatives thereof, represented by the general formula (4).

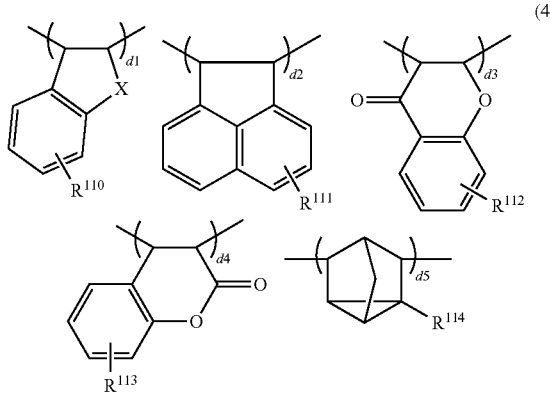

(4)

Herein $R^{110}$ to $R^{114}$ are each independently selected from among hydrogen, $C_1$-$C_{30}$ alkyl, partially or entirely halo-substituted alkyl, hydroxyl, alkoxy, alkanoyl or alkoxycarbonyl, $C_6$-$C_{10}$ aryl, halogen, and 1,1,1,3,3,3-hexafluoro-2-propanol, and X is methylene, oxygen or sulfur. The subscripts d1 to d5 are numbers in the range: $0 \le d1 \le 0.4$, $0 \le d2 \le 0.4$, $0 \le d3 \le 0.4$, $0 \le d4 \le 0.4$, $0 \le d5 \le 0.4$, and $0 \le d1+d2+d3+d4+d5 \le 0.5$.

Besides the recurring units (a) to (d), additional recurring units (e) may be copolymerized in the polymer, which include recurring units derived from styrene, vinylnaphthalene, vinylanthracene, vinylpyrene, methyleneindene, and the like.

The polymer defined above may be synthesized by any desired methods, for example, by dissolving one or more monomers selected from the monomers corresponding to the recurring units (a) to (e) in an organic solvent, adding a radical polymerization initiator thereto, and effecting heat polymerization. Examples of the organic solvent which can be used for polymerization include toluene, benzene, tetrahydrofuran, diethyl ether, dioxane, cyclohexane, cyclopentane, methyl ethyl ketone, and γ-butyrolactone. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the system is heated at 50 to 80° C. for polymerization to take place. The reaction time is 2 to 100 hours, preferably 5 to 20 hours.

When hydroxystyrene or hydroxyvinylnaphthalene is copolymerized, an alternative method is possible. Specifically, acetoxystyrene or acetoxyvinylnaphthalene is used instead of hydroxystyrene or hydroxyvinylnaphthalene, and after polymerization, the acetoxy group is deprotected by alkaline hydrolysis as mentioned above, for thereby converting the relevant units to hydroxystyrene or hydroxyvinylnaphthalene units. For alkaline hydrolysis, a base such as aqueous ammonia or triethylamine may be used. The reaction temperature is −20° C. to 100° C., preferably 0° C. to 60° C., and the reaction time is 0.2 to 100 hours, preferably 0.5 to 20 hours.

In the copolymer, recurring units (a) to (e) may be incorporated in the following molar fraction:
$0<a<1.0$, $0<b\le0.9$, $0\le c\le0.5$, $0\le d\le0.5$, and $0\le e\le0.5$,
preferably $0.1\le a\le0.9$, $0.1\le b\le0.9$, $0\le c<0.4$, $0\le d\le0.4$, and $0\le e\le0.4$,
more preferably $0.15\le a\le0.8$, $0.2\le b\le0.8$, $0\le c\le0.3$, $0\le d\le0.3$, and $0\le e\le0.3$, and
even more preferably $0.20\le a\le0.7$, $0.25\le b\le0.7$, $0\le c\le0.25$, $0\le d\le0.25$, and $0\le e\le0.25$,
provided that c=c1+c2+c3, d=d1+d2+d3+d4+d5, and a+b+c+d+e=1.

The polymer serving as the base resin in the positive resist composition should have a weight average molecular weight (Mw) in the range of 1,000 to 500,000, and preferably 2,000 to 30,000. With too low a Mw, the resist composition may become less heat resistant. A polymer with too high a Mw may lose alkaline solubility and give rise to a footing phenomenon after pattern formation. As used herein, the weight average molecular weight (Mw) is measured by gel permeation chromatography (GPC) versus polystyrene standards using tetrahydrofuran as a solvent.

If a multi-component polymer has a wide molecular weight distribution or dispersity (Mw/Mn), which indicates the presence of lower and higher molecular weight polymer fractions, there is a possibility that foreign matter is left on the pattern or the pattern profile is degraded. The influences of molecular weight and dispersity become stronger as the pattern rule becomes finer. Therefore, the multi-component polymer should preferably have a narrow dispersity (Mw/Mn) of 1.0 to 2.0, especially 1.0 to 1.5, in order to provide a resist composition suitable for micropatterning to a small feature size.

It is understood that a mixture of two or more polymers which differ in compositional ratio, molecular weight or dispersity is acceptable as well as a mixture of a polymer comprising recurring units (a) of formula (1) with another polymer free of recurring units (a) of formula (1).

Novolak Resin

The base resin used in the positive resist composition is a blend of the (meth)acrylate polymer defined above with a novolak resin of dihydroxynaphthalene. The blending of a dihydroxynaphthalene novolak resin is effective for improving step coverage on a stepped substrate, for suppressing substrate reflection due to its adequate absorption to ArF excimer laser radiation of 193 nm wavelength, and for improving adhesion to an inorganic substrate.

Examples of the dihydroxynaphthalene from which the novolak resin is prepared include 1,2-dihydroxynaphthalene, 1,3-dihydroxynaphthalene, 1,4-dihydroxynaphthalene, 1,5-dihydroxynaphthalene, 1,6-dihydroxynaphthalene, 1,7-dihydroxynaphthalene, 1,8-dihydroxynaphthalene, 2,3-dihydroxynaphthalene, 2,4-dihydroxynaphthalene, 2,5-dihydroxynaphthalene, 2,6-dihydroxynaphthalene, 2,7-dihydroxynaphthalene, and 2,8-dihydroxynaphthalene. Examples of the compound which can be co-condensed together with dihydroxynaphthalene include 1-naphthol, 2-naphthol, 2-methyl-1-naphthol, 4-methoxy-1-naphthol, 7-methoxy-2-naphthol, 6-methoxy-2-naphthol, 3-methoxy-2-naphthol, 1,4-dimethoxynaphthalene, 1,5-dimethoxynaphthalene, 1,6-dimethoxynaphthalene, 1,7-dimethoxynaphthalene, 1,8-dimethoxynaphthalene, 2,3-dimethoxynaphthalene, 2,6-dimethoxynaphthalene, 2,7-dimethoxynaphthalene, methyl 3-hydroxy-naphthalene-2-carboxylate, naphthalene, 1-methylnaphthalene, 2-methylnaphthalene, 1,2-dimethylnaphthalene, 1,3-dimethylnaphthalene, 1,4-dimethylnaphthalene, 1,5-dimethylnaphthalene, 1,6-dimethylnaphthalene, 1,7-dimethylnaphthalene, 1,8-dimethylnaphthalene, 2,3-dimethylnaphthalene, 2,6-dimethylnaphthalene, 2,7-dimethylnaphthalene, 1-ethylnaphthalene, 2-ethylnaphthalene, 1-propylnaphthalene, 2-propylnaphthalene, 1-butylnaphthalene, 2-butylnaphthalene, 1-phenylnaphthalene, 1-cyclohexylnaphthalene, 1-cyclopentylnaphthalene, 1,1'-bi(2-naphthol), o-cresol, m-cresol, p-cresol, indene, hydroxyanthracene, acenaphthylene, acenaphthene, biphenyl, bisphenol, trisphenol, dicyclopentadiene, and 1,5-dimethlnaphthalene. Binary co-condensation of dihydroxynaphthalene and another monomer is acceptable. The dihydroxynaphthalenes may be used alone or in admixture of two or more. When dihydroxynaphthalene and another compound are co-condensed, the dihydroxynaphthalene preferably accounts for 99 to 1 mol %, more preferably 95 to 5 mol %.

Since the dihydroxynaphthalene novolak resin has a high alkaline dissolution rate, the resist composition based on a blend of the (meth)acrylate polymer defined above and the dihydroxynaphthalene novolak resin leaves little scum in the space area after development. However, too high an alkaline dissolution rate may result in a film loss of the resist pattern. The alkaline dissolution rate may be moderated by co-condensing naphthol (having one hydroxyl group) or an alkoxynaphthalene or dialkoxynaphthalene in which a hydroxyl group has been replaced by an alkoxy group.

A novolak resin is generally prepared from a dihydroxynaphthalene by adding an aldehyde thereto. Novolak formation increases the molecular weight, which is effective for preventing outgassing and particle formation of a low molecular weight fraction during bake. Examples of suitable aldehydes include formaldehyde, trioxane, paraformaldehyde, benzaldehyde, methoxybenzaldehyde, phenylbenzaldehyde, tritylbenzaldehyde, cyclohexylbenzaldehyde, cyclopentylbenzaldehyde, t-butylbenzaldehyde, naphthalene aldehyde, hydroxynaphthalene aldehyde, anthracene aldehyde, fluorene aldehyde, pyrene aldehyde, methoxynaphthalene aldehyde, dimethoxynaphthalene aldehyde, acetaldehyde, propylaldehyde, phenyl acetaldehyde, naphthalene acetaldehyde, substituted or unsubstituted carboxylnaphthalene acetaldehyde, α-phenylpropylaldehyde, β-phenylpropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, furfural, furancarboxyaldehyde, and thiophene aldehyde. Inter alia, formaldehyde is preferred. The aldehydes may be used alone or in admixture of two or more. The aldehyde is preferably used in an amount of 0.2 to 5 moles, more preferably 0.5 to 2 moles per mole of the dihydroxynaphthalene.

A catalyst may be used in the condensation reaction between dihydroxynaphthalene and aldehyde. Suitable catalysts are acidic catalysts including hydrochloric acid, nitric acid, sulfuric acid, formic acid, oxalic acid, acetic acid, methanesulfonic acid, camphorsulfonic acid, tosylic acid, and trifluoromethanesulfonic acid. The acidic catalyst is preferably used in an amount of $1 \times 10^{-5}$ to $5 \times 10^{-1}$ mole per mole of the dihydroxynaphthalene.

The dihydroxynaphthalene novolak resin may have a weight average molecular weight (Mw) of 400 to 20,000, preferably 500 to 10,000, and more preferably 600 to 10,000. A resin with a lower Mw is more effective for step coverage, but leads to inferior lithography performance due to enhanced acid diffusion. Thus the molecular weight of the novolak resin must be optimized in the light of step coverage and lithography performance. One effective means for meeting both step coverage and lithography performance is to cut off as much un-polymerized dihydroxynaphthalene as possible from the polymer product and to minimize the content of low molecular weight dimer and trimer fractions.

The (meth)acrylate polymer having an acid labile group and the dihydroxynaphthalene novolak resin are preferably blended in such a ratio that the blend may consist of 50 to 95% by weight the (meth)acrylate polymer and 50 to 5% by weight of the dihydroxynaphthalene novolak resin. Since the dihydroxynaphthalene novolak resin is alkali soluble, its presence in a higher blend ratio may lead to a film loss of the resist pattern after development. Since the dihydroxynaphthalene novolak resin has absorption at wavelength 193 nm, its presence in a higher blend ratio may lead to a resist pattern of tapered profile after development. For these reasons, it is recommended to optimize the blend ratio.

Acid Generator

The positive resist composition contains an acid generator in order that it function as a chemically amplified positive resist composition in the pattern forming process. The acid generator is typically a compound capable of generating an acid in response to actinic light or radiation, that is, photoacid generator (PAG). The PAG may be any compound capable of generating an acid upon exposure to high-energy radiation. Suitable PAGs include sulfonium salts, iodonium salts, sulfonyldiazomethane, N-sulfonyloxyimide, and oxime-O-sulfonate acid generators. The acid generators may be used alone or in admixture of two or more. Exemplary PAGs are described in U.S. Pat. No. 7,537,880 (JP-A 2008-111103, paragraphs [0122] to [0142]).

Onium salts such as sulfonium salts, iodonium salts and ammonium salts of sulfonic acids which are not fluorinated at α-position as described in US 2008153030 (JP-A 2008-158339) and similar onium salts of carboxylic acid may be used as the quencher. While an α-position fluorinated sulfonic acid, imide acid, and methide acid are necessary to deprotect the acid labile group of carboxylic acid ester, an α-position non-fluorinated sulfonic acid and a carboxylic acid are released by salt exchange with an onium salt which is not fluorinated at α-position. An α-position non-fluorinated sulfonic acid and a carboxylic acid function as a quencher because they do not induce deprotection reaction. In particular, since sulfonium salts and iodonium salts of an α-position non-fluorinated sulfonic acid and a carboxylic acid are photodecomposable, those portions receiving a high light intensity are reduced in quenching capability and increased in the concentration of a α-position fluorinated sulfonic acid, imide acid, or methide acid. As a result, the exposed portions are improved in contrast. Onium salts including sulfonium salts, iodonium salts and ammonium salts of an α-position non-fluorinated sulfonic acid and a carboxylic acid are highly effective in controlling the diffusion of an α-position fluorinated sulfonic acid, imide acid and methide acid. This is because the onium salt resulting from salt exchange is less mobile due to a higher molecular weight. The addition of onium salts including sulfonium salts, iodonium salts and ammonium salts of an α-position non-fluorinated sulfonic acid and a carboxylic acid as well as a carbamate compound capable of generating an amine compound under the action of acid is very important from the aspect of controlling acid diffusion.

The resist composition may further comprise an organic solvent, basic compound, dissolution regulator, surfactant, acetylene alcohol, and other components. Examples of the organic solvent used herein are described in JP-A 2008-111103, paragraphs [0144] to [0145] (U.S. Pat. No. 7,537,880), suitable basic compounds in paragraphs [0146] to [0164], and suitable surfactants in paragraphs [0165] to [0166]. Suitable compounds capable of generating amine under the action of acid are carbamate compounds as described in JP 3790649. Exemplary dissolution regulators are described in JP-A 2008-122932 (US 2008090172), paragraphs [0155] to [0178], and exemplary acetylene alcohols in paragraphs [0179] to [0182]. Polymeric quenchers as described in JP-A 2008-239918 are also useful. The polymeric quencher segregates at the surface of a resist film as coated and serves to enhance the rectangularity of a resist pattern. Also, in the immersion lithography application where a protective film is applied on a resist film, the polymeric quencher is effective for preventing a resist pattern from a film loss and top rounding.

Notably, appropriate amounts of respective components added per 100 parts by weight of the base resin are described below. An amount of the acid generator is 0.01 to 100 parts, preferably 0.1 to 80 parts by weight, an amount of the organic solvent is 50 to 10,000 parts, preferably 100 to 5,000 parts by weight, an amount of the dissolution regulator is 0 to 50 parts, preferably 0 to 40 parts by weight, an amount of the basic compound is 0 to 100 parts, preferably 0.001 to 50 parts by weight, and an amount of the surfactant is 0 to 10 parts, preferably 0.0001 to 5 parts by weight.

Process

The positive resist composition, typically chemically amplified positive resist composition comprising a polymer comprising recurring units of (meth)acrylate having an acid labile group, preferably represented by formula (1), a dihydroxynaphthalene novolak resin, preferably represented by formula (2), an acid generator, and a basic compound is used in the fabrication of various integrated circuits. Pattern formation using the resist composition may be performed by well-known lithography processes. The process generally involves coating, prebaking, exposure, PEB, and development. If necessary, any additional steps may be added.

The positive resist composition is first applied onto a substrate on which an integrated circuit is to be formed (e.g., Si, $SiO_2$, SiN, SiON, TiN, WSi, BPSG, SOG, or organic antireflective coating) or a substrate on which a mask circuit is to be formed (e.g., Cr, CrO, CrON, or MoSi) by a suitable coating technique such as spin coating, roll coating, flow coating, dip coating, spray coating or doctor coating. The coating is prebaked on a hot plate at a temperature of 60 to 150° C. for 10 seconds to 30 minutes, preferably 80 to 120° C. for 30 seconds to 20 minutes. The resulting resist film is generally 0.1 to 2.0 µm thick.

In the embodiment wherein the resist pattern is used in the ion implantation process, a silicon substrate is most often used as the base. Although an organic bottom antireflective coating (BARC) interposed between the resist film and the substrate is effective for improving the adhesion of the resist film for thereby preventing pattern collapse, the BARC interferes with ion implantation because the open area of the resist pattern is covered with the BARC. Thus the resist film intended for ion implantation is formed directly on the silicon substrate. Then significant reflection from the substrate and pattern collapse due to a lowering of adhesion strength become problems. Adhesion may be enhanced by pretreating the substrate with hexamethyldisilazane (HMDS). Decomposition of HMDS causes conversion of silanol groups on the silicon substrate to trimethylsilyl groups whereby the substrate is made more hydrophobic so that its surface energy may become substantially equal to that of the resist film, resulting in improved adhesion strength.

An antireflective coating or topcoat may be formed on top of the resist film. The topcoat used herein is typically a water-soluble topcoat because it does not intermix with the resist film and is strippable during development. A highly water-repellent topcoat as used in the immersion lithography may also be formed. The topcoat for the immersion lithography may be applied not only in the immersion lithography, but also in the dry lithography.

The resist film is then exposed to a desired pattern of high-energy radiation such as UV, deep-UV, electron beam, x-ray, excimer laser light, γ-ray, synchrotron radiation or EUV (soft x-ray), directly or through a mask. The exposure dose is preferably about 1 to 200 mJ/cm$^2$, more preferably about 10 to 100 mJ/cm$^2$, or 0.1 to 100 µC/cm$^2$, more preferably 0.5 to 50 µC/cm$^2$. The resist film is further baked (PEB) on a hot plate at 60 to 150° C. for 10 seconds to 30 minutes, preferably 80 to 120° C. for 30 seconds to 20 minutes.

Thereafter the resist film is developed with a developer in the form of an aqueous base solution for 3 seconds to 3 minutes, preferably 5 seconds to 2 minutes by conventional techniques such as dip, puddle or spray techniques. Suitable developers are 0.1 to 15 wt %, preferably 2 to 10 wt % aqueous solutions of tetramethylammonium hydroxide (TMAH), tetraethylammonium hydroxide (TEAH), tetrapropylammonium hydroxide (TPAH) and tetrabutylammonium hydroxide (TBAH), choline hydroxide, morpholine, trimethylamine, triethylamine, ethanolamine, diethanolamine, triethanolamine, ammonia, sodium hydroxide and potassium hydroxide. The resist film in the exposed area is dissolved in the developer whereas the resist film in the unexposed area is not dissolved. In this way, the desired positive pattern is formed on the substrate. It is appreciated that the resist composition of the invention is suited for micropatterning using such high-energy radiation as excimer laser radiation, EB, EUV (soft x-ray), x-ray, γ-ray and synchrotron radiation. Among others, the resist composition is best suited for micropatterning with ArF excimer laser radiation of 193 nm wavelength. Patterning with ArF excimer laser may be either dry exposure wherein the space between the lens and the wafer is air or nitrogen atmosphere or immersion exposure wherein the space is filled with a liquid.

The ArF immersion lithography uses deionized water or liquids having a refractive index of at least 1 and highly transparent to the exposure wavelength such as alkanes as the immersion solvent. The immersion lithography involves exposing the prebaked resist film to light through a projection lens, with deionized water or another liquid introduced between the resist film and the projection lens. Since this allows lenses to be designed to a NA of 1.0 or higher, formation of finer feature size patterns is possible. The immersion lithography is important for the ArF lithography to survive to the 45-nm node. In the case of immersion lithography, deionized water rinsing (or post-soaking) may be carried out after exposure for removing water droplets left on the resist film. Alternatively, a protective coating may be applied onto the resist film after pre-baking for preventing any leach-outs from the resist film and improving water slip on the film surface. The resist protective coating used in the immersion lithography is preferably formed from a solution of a polymer having 1,1,1,3,3,3-hexafluoro-2-propanol residues which is insoluble in water, but soluble in an alkaline developer liquid, in a solvent selected from alcohols of at least 4 carbon atoms, ethers of 8 to 12 carbon atoms, and mixtures thereof. After formation of the resist film, deionized water rinsing (or post-soaking) may be carried out for extracting the acid generator and the like from the film surface or washing away particles, or after exposure, rinsing (or post-soaking) may be carried out for removing water droplets left on the resist film.

To the resist composition, an additive for rendering the resist surface water repellent may be added. A typical additive is a polymer having a fluoroalcohol group. After spin coating, the polymer segregates toward the resist surface to reduce the surface energy, thereby improving water slip. Such additives are described in JP-A 2007-297590 and JP-A 2008-122932. The water repellency improver is essential when the immersion lithography is implemented without using a protective film although it may also be added in the case of dry lithography. The surface of a resist film as spin coated is covered with the water repellency improver, which is effective for preventing evaporation and re-deposition of acid and amine, and thus avoiding the occurrence of chemical flare.

Development may be terminated by rinsing with deionized water and spin drying for removing the rinse liquid. Since pattern collapse can occur during the spin drying step, a surfactant may have been added to the rinse liquid for reducing the stress during the drying.

Once the resist pattern is formed by development, it may be further baked for inducing a thermal flow. The thermal flow is effective for shrinking the size of a hole pattern.

Next, ion implantation is carried out using the resist pattern as a mask. Examples of the dopant to be implanted include boron, phosphorus and arsenic. The dopant gas may be $BF_3$, $PH_3$, or $AsH_3$. It may be implanted into the substrate at an acceleration voltage of several keV to several MeV using the resist pattern as a mask. The resist film must be resistant to ion implantation.

It is generally believed that resistance to ion implantation is correlated to resistance to etching with fluorocarbon gas. The KrF resist material based on hydroxystyrene has lower etch resistance and ion implantation resistance than the i-line resist material based on novolak resin. The ArF resist material based on alicyclic structure has lower etch resistance and ion implantation resistance than the KrF resist material. Since the ArF resist material is short of ion implantation resistance if based on only alicyclic structure, it must be improved in that resistance.

EXAMPLE

Examples of the invention are given below by way of illustration and not by way of limitation. The abbreviation "pbw" is parts by weight. For all polymers, Mw and Mn are determined by GPC versus polystyrene standards using tetrahydrofuran solvent.

Synthesis Example 1

Polymers were prepared by selecting and combining suitable monomers, conducting copolymerization reaction in tetrahydrofuran medium, crystallizing from methanol, repeatedly washing with hexane, isolation and drying. The resulting polymers, designated Polymers 1 to 12 and Comparative Polymer 1, had the composition shown below and were suitable for use in resist compositions. The polymer was analyzed for composition by $^1$H-NMR spectroscopy and for Mw and Mw/Mn by GPC.

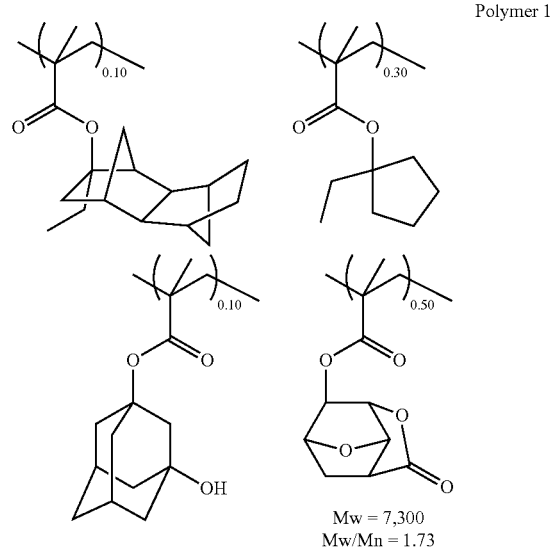

Polymer 1

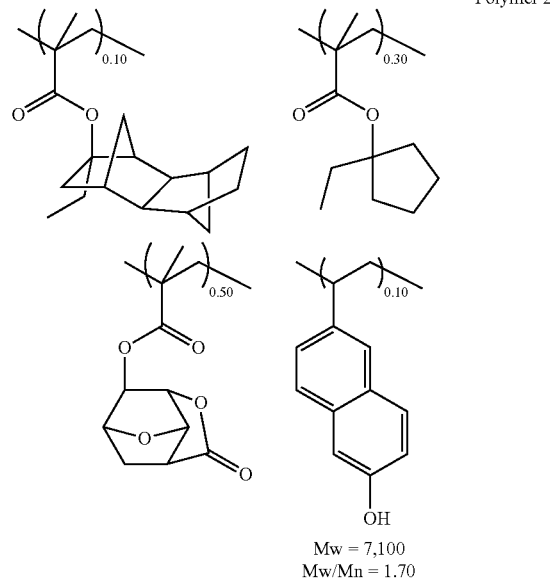

Polymer 2

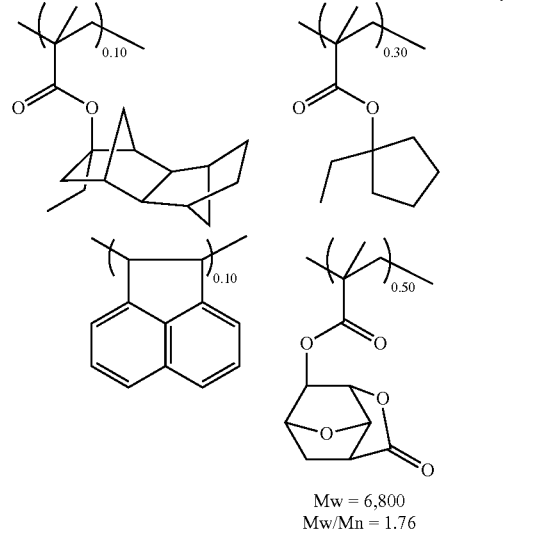

Polymer 3

Polymer 4
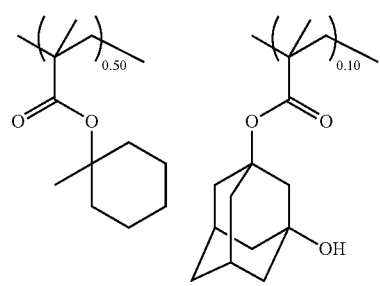
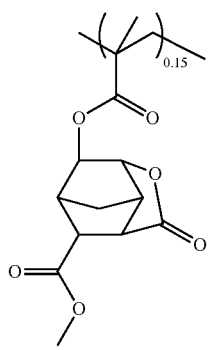
Mw = 9,500
Mw/Mn = 1.91
Polymer 5
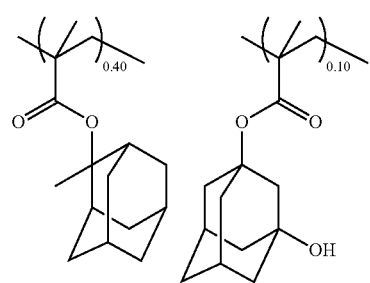
Mw = 8,900
Mw/Mn = 1.89
Polymer 6
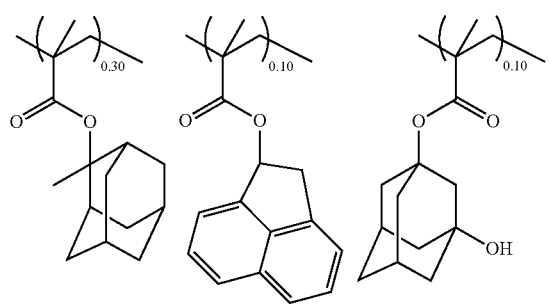
Mw = 7,600
Mw/Mn = 1.69
Polymer 7
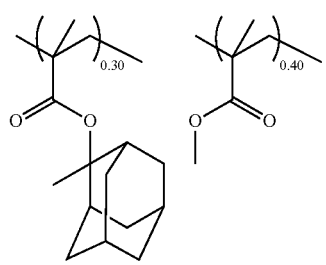
Mw = 6,600
Mw/Mn = 1.98
Polymer 8
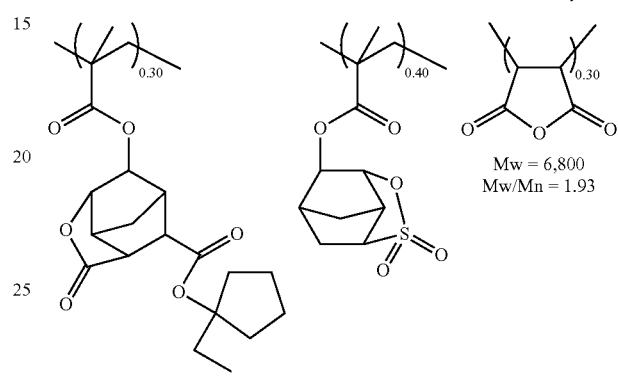
Mw = 6,800
Mw/Mn = 1.93
Polymer 9
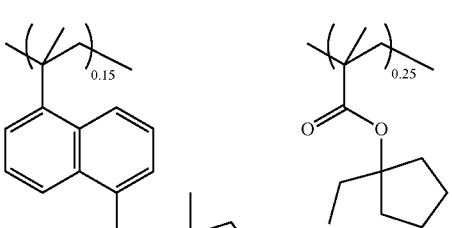
Mw = 7,600
Mw/Mn = 1.69
Polymer 10
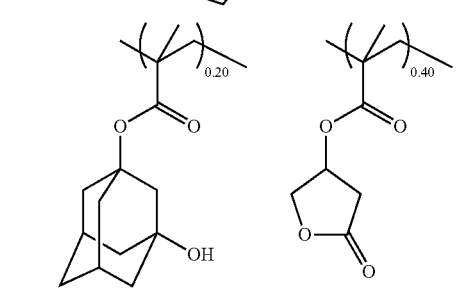

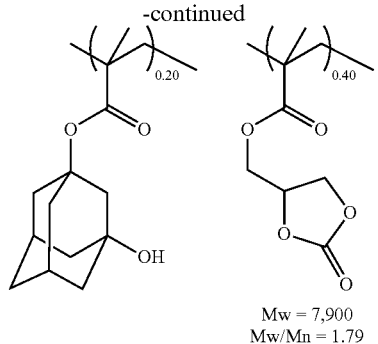

Mw = 7,900
Mw/Mn = 1.79

Polymer 11

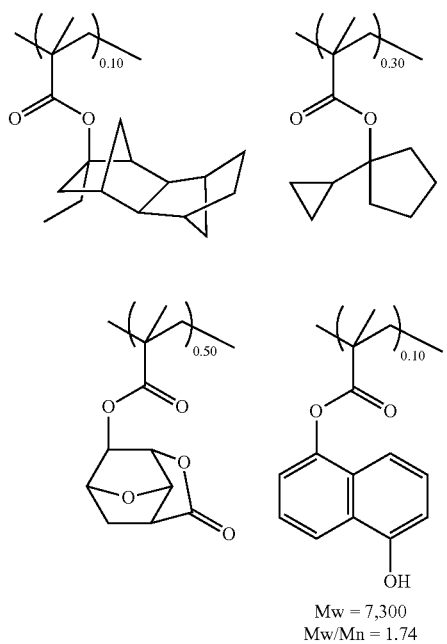

Mw = 7,300
Mw/Mn = 1.74

Polymer 12

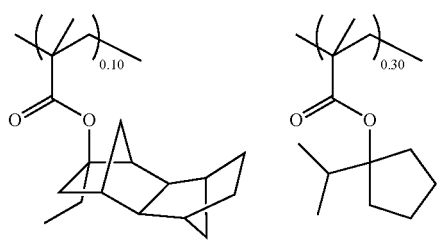

Mw = 7,700
Mw/Mn = 1.97

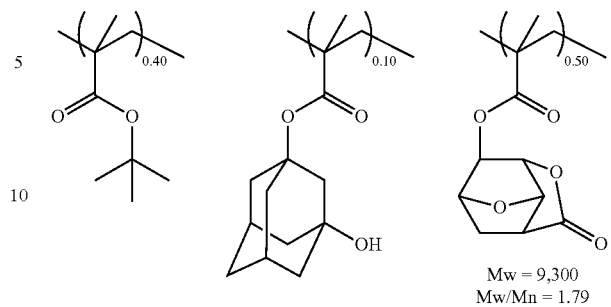

Comparative Polymer 1

Mw = 9,300
Mw/Mn = 1.79

Synthesis Example 2

Novolak resins were prepared by adding a dihydroxynaphthalene and a co-condensing compound to 37 wt % formalin aqueous solution along with oxalic acid, and stirring at 100° C. for 24 hours. The reaction was followed by dissolving the reaction mixture in 500 ml of methyl isobutyl ketone, thoroughly washing with water to remove the catalyst and metal impurities, evaporating off the solvent under a reduced pressure, and heating at 150° C. and 2 mmHg to remove water and unreacted monomers. The resulting resins, designated Novolak Resins 1 to 18 and Comparative Novolak Resins 1 and 2, had the composition shown below.

Notably, Novolak Resin 9 was prepared using 2-naphthaldehyde dioxane solution instead of the 37 wt % formalin aqueous solution. Novolak Resin 10 was prepared using 50 wt % 6-hydroxy-2-naphthaldehyde dioxane solution instead of the 37 wt % formalin aqueous solution. Novolak Resin 11 was prepared using 50 wt % 3-furancarboxyaldehyde dioxane solution instead of the 37 wt % formalin aqueous solution. Novolak Resin 12 was prepared using 50 wt % 3-thiophenaldehyde dioxane solution instead of the 37 wt % formalin aqueous solution.

Novolak Resin 14 was prepared using 50 wt % Aldehyde-1 dioxane solution instead of the 37 wt % formalin aqueous solution. Novolak Resin 15 was prepared using 50 wt % Aldehyde-2 dioxane solution instead of the 37 wt % formalin aqueous solution. Novolak Resin 16 was prepared using 50 wt % Aldehyde-3 dioxane solution instead of the 37 wt % formalin aqueous solution. Novolak Resin 17 was prepared using 50 wt % Aldehyde-4 dioxane solution instead of the 37 wt % formalin aqueous solution. Novolak Resin 18 was prepared using 50 wt % Aldehyde-5 dioxane solution instead of the 37 wt % formalin aqueous solution.

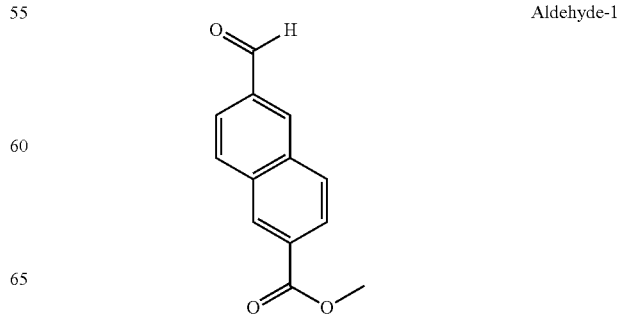

Aldehyde-1

Aldehyde-2
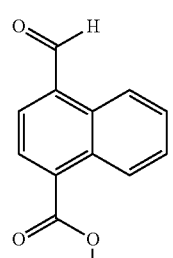
Aldehyde-3
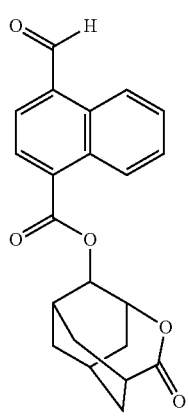
Aldehyde-4
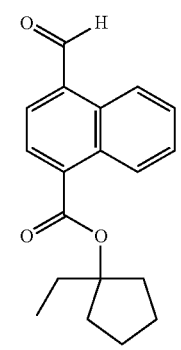
Aldehyde-5
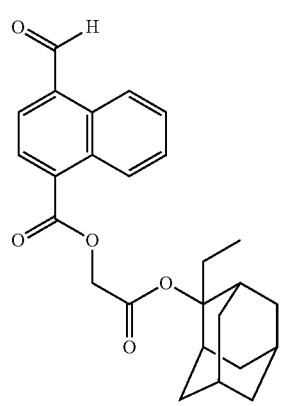
Novolak Resin 1
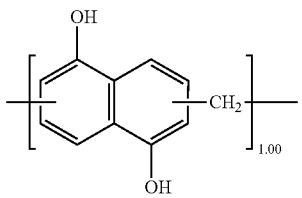
Mw = 1,200
Mw/Mn = 3.10
Novolak Resin 2
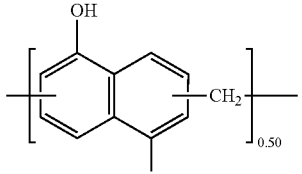
Mw = 1,300
Mw/Mn = 3.96
Novolak Resin 3
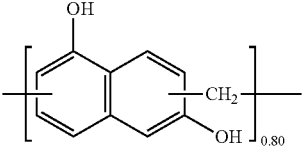
Mw = 2,200
Mw/Mn = 3.89
Novolak Resin 4
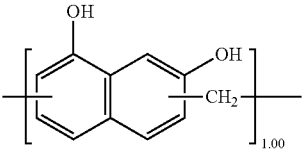
Mw = 1,200
Mw/Mn = 3.10
Novolak Resin 5
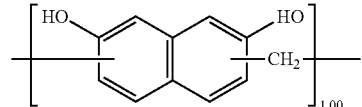
Mw = 1,900
Mw/Mn = 3.90

Novolak Resin 6
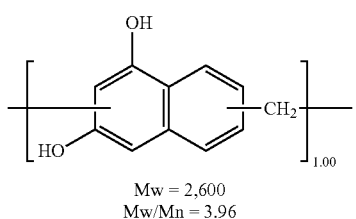
Mw = 2,600
Mw/Mn = 3.96
Novolak Resin 7
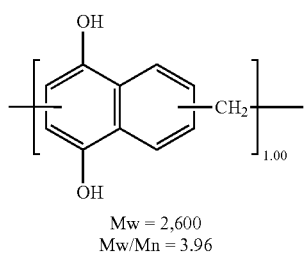
Mw = 2,600
Mw/Mn = 3.96
Novolak Resin 8
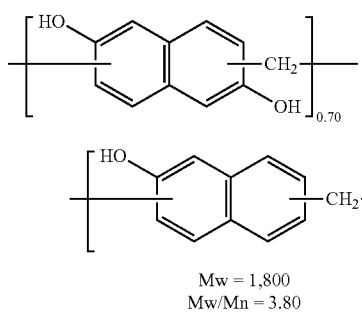
Mw = 1,800
Mw/Mn = 3.80
Novolak Resin 9
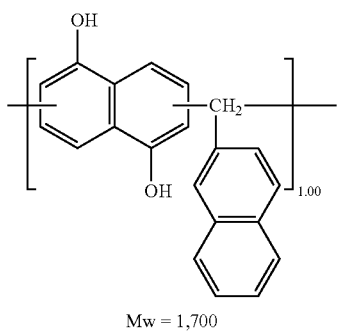
Mw = 1,700
Mw/Mn = 3.30
Novolak Resin 10
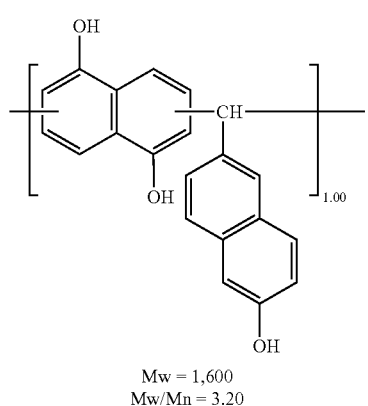
Mw = 1,600
Mw/Mn = 3.20
Novolak Resin 11
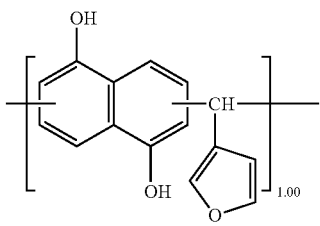
Mw = 1,800
Mw/Mn = 3.80
Novolak Resin 12
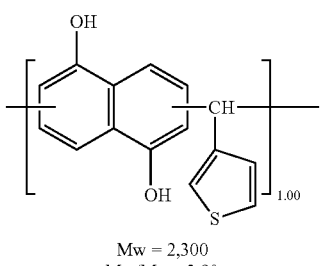
Mw = 2,300
Mw/Mn = 3.90
Novolak Resin 13
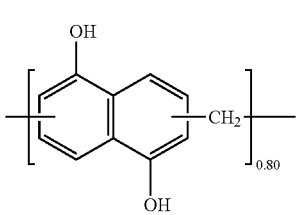
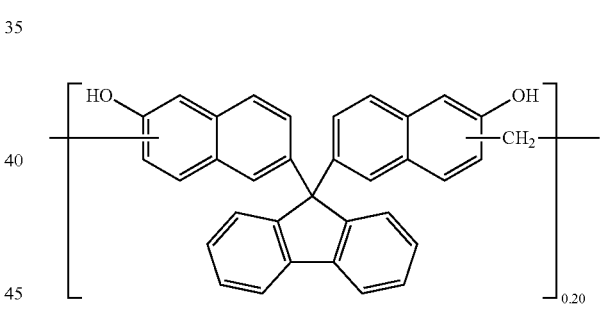
Mw = 2,600
Mw/Mn = 4.20
Novolak Resin 14
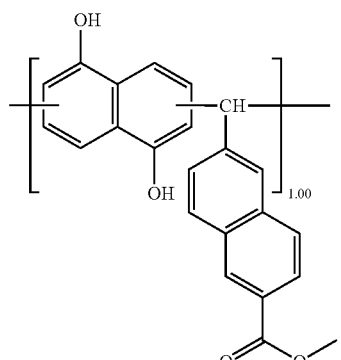
Mw = 1,900
Mw/Mn = 3.60

Novolak Resin 15

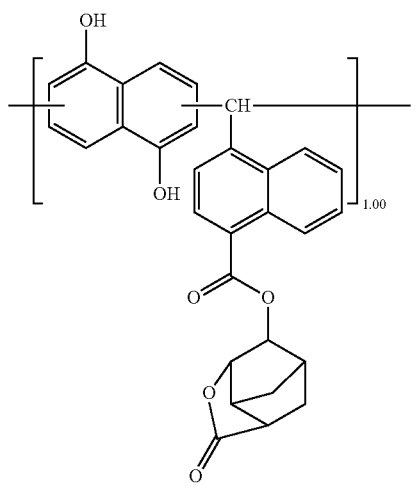

Mw = 2,300
Mw/Mn = 3.70

Novolak Resin 16

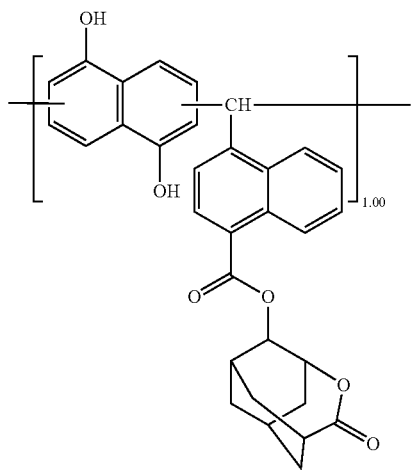

Mw = 2,800
Mw/Mn = 3.90

Novolak Resin 17

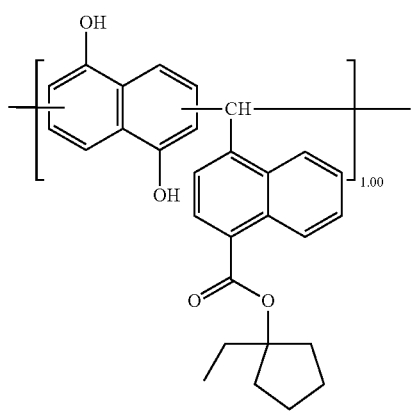

Mw = 2,500
Mw/Mn = 3.90

Novolak Resin 18

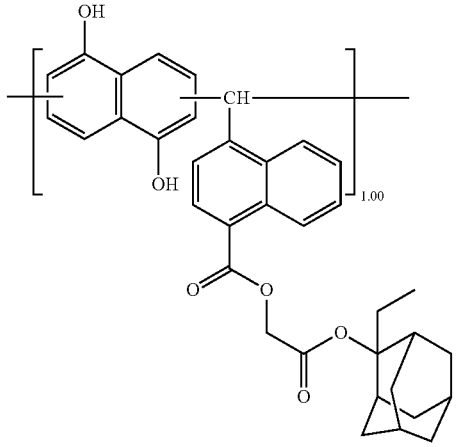

Mw = 2,600
Mw/Mn = 4.10

Comparative Novolak Resin 1

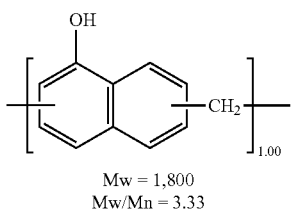

Mw = 1,800
Mw/Mn = 3.33

Comparative Novolak Resin 2

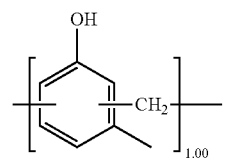

Mw = 6,900
Mw/Mn = 5.53

EXAMPLES AND COMPARATIVE EXAMPLES

Positive resist compositions were prepared by dissolving a polymer, a novolak resin, and selected components in a solvent in accordance with the recipe shown in Table 1, and filtering the solution through a filter having a pore size of 0.2 The solvent contained 100 ppm of a surfactant FC-4430 (3M Sumitomo Co., Ltd.).

The components in Table 1 are as identified below.

Polymers 1 to 12, Novolak Resins 1 to 18, Comparative Polymer 1, Comparative Novolak Resins 1, 2: synthesized above Organic Solvents:
propylene glycol monomethyl ether acetate (PGMEA)
cyclohexanone (CyH)

Acid generators: PAG1 to PAG4 of the following structural formulae

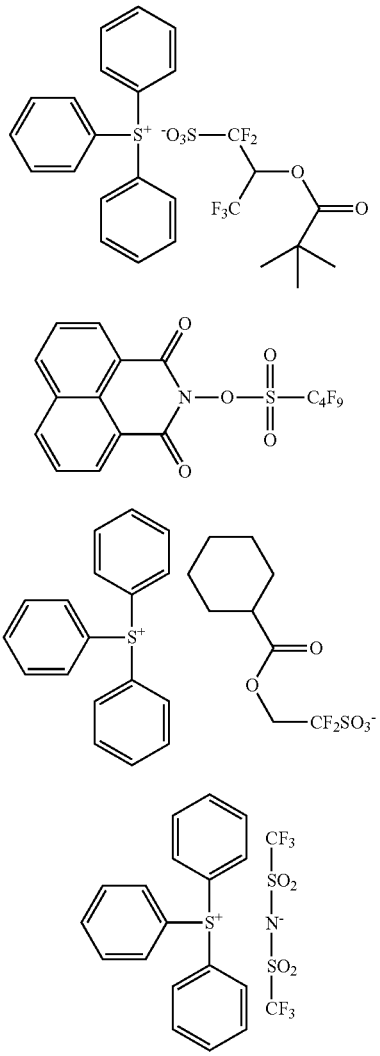

Basic compounds: Quenchers 1 to 4 of the following structural formulae

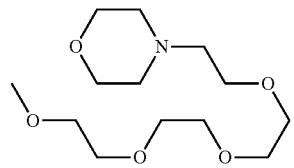

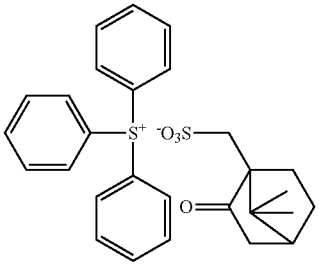

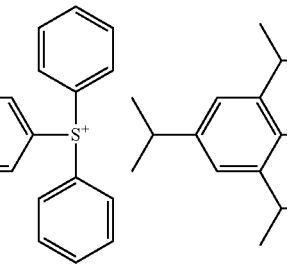

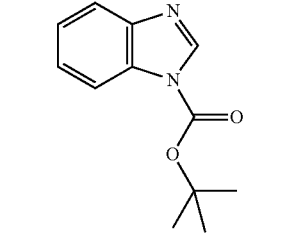

TABLE 1

|  |  | Polymer (pbw) | Resin (pbw) | Acid generator (pbw) | Basic compound (pbw) | Organic solvent (pbw) |
| --- | --- | --- | --- | --- | --- | --- |
| Example | 1 | Polymer 1 (80) | Novolak Resin 1 (20) | PAG 1 (4) | Quencher 1 (0.6) | PGMEA(1,500) CyH(200) |
|  | 2 | Polymer 2 (85) | Novolak Resin 1 (15) | PAG 2 (4) | Quencher 2 (3.0) | PGMEA(1,500) CyH(200) |
|  | 3 | Polymer 3 (85) | Novolak Resin 1 (15) | PAG 2 (4) | Quencher 4 (0.5) | PGMEA(1,500) CyH(200) |
|  | 4 | Polymer 4 (80) | Novolak Resin 1 (20) | PAG 3 (4) | Quencher 1 (0.6) | PGMEA(1,500) CyH(200) |
|  | 5 | Polymer 5 (80) | Novolak Resin 1 (20) | PAG 1 (4) | Quencher 1 (0.6) | PGMEA(1,500) CyH(200) |
|  | 6 | Polymer 6 (80) | Novolak Resin 1 (20) | PAG 1 (4) | Quencher 1 (0.6) | PGMEA(1,500) CyH(200) |
|  | 7 | Polymer 7 (65) | Novolak Resin 2 (35) | PAG 1 (4) | Quencher 2 (3.0) | PGMEA(1,500) CyH(200) |
|  | 8 | Polymer 8 (60) | Novolak Resin 2 (40) | PAG 2 (4) | Quencher 3 (3.0) | PGMEA(1,500) CyH(200) |

TABLE 1-continued

| | | Polymer (pbw) | Resin (pbw) | Acid generator (pbw) | Basic compound (pbw) | Organic solvent (pbw) |
|---|---|---|---|---|---|---|
| | 9 | Polymer 9 (85) | Novolak Resin 1 (15) | PAG 1 (4) | Quencher 1 (0.6) | PGMEA(1,500) CyH(200) |
| | 10 | Polymer 10 (85) | Novolak Resin 1 (15) | PAG 1 (4) | Quencher 1 (0.6) | PGMEA(1,500) CyH(200) |
| | 11 | Polymer 1 (80) | Novolak Resin 2 (20) | PAG 1 (4) | Quencher 1 (0.6) | PGMEA(1,500) CyH(200) |
| | 12 | Polymer 1 (80) | Novolak Resin 3 (20) | PAG 1 (4) | Quencher 1 (0.6) | PGMEA(1,500) CyH(200) |
| | 13 | Polymer 1 (80) | Novolak Resin 4 (20) | PAG 4 (4) | Quencher 1 (0.6) | PGMEA(1,500) CyH(200) |
| | 14 | Polymer 1 (80) | Novolak Resin 5 (20) | PAG 1 (4) | Quencher 3 (3.0) | PGMEA(1,500) CyH(200) |
| | 15 | Polymer 1 (80) | Novolak Resin 6 (20) | PAG 1 (4) | Quencher 1 (0.6) | PGMEA(1,500) CyH(200) |
| | 16 | Polymer 1 (80) | Novolak Resin 7 (20) | PAG 1 (4) | Quencher 1 (0.6) | PGMEA(1,500) CyH(200) |
| | 17 | Polymer 1 (80) | Novolak Resin 8 (20) | PAG 1 (4) | Quencher 1 (0.6) | PGMEA(1,500) CyH(200) |
| | 18 | Polymer 11 (85) | Novolak Resin 1 (15) | PAG 1 (4) | Quencher 1 (0.6) | PGMEA(1,500) CyH(200) |
| | 19 | Polymer 12 (85) | Novolak Resin 1 (15) | PAG 1 (4) | Quencher 1 (0.6) | PGMEA(1,500) CyH(200) |
| | 20 | Polymer 1(45) Polymer 12(40) | Novolak Resin 1 (15) | PAG 1 (4) | Quencher 1 (0.6) | PGMEA(1,500) CyH(200) |
| | 21 | Polymer 1 (80) | Novolak Resin 9 (20) | PAG 1 (4) | Quencher 1 (0.6) | PGMEA(1,500) CyH(200) |
| | 22 | Polymer 1 (80) | Novolak Resin 10 (20) | PAG 1 (4) | Quencher 1 (0.6) | PGMEA(1,500) CyH(200) |
| | 23 | Polymer 1 (80) | Novolak Resin 11 (20) | PAG 1 (4) | Quencher 1 (0.6) | PGMEA(1,500) CyH(200) |
| | 24 | Polymer 1 (80) | Novolak Resin 12 (20) | PAG 1 (4) | Quencher 1 (0.6) | PGMEA(1,500) CyH(200) |
| | 25 | Polymer 1 (80) | Novolak Resin 13 (20) | PAG 1 (4) | Quencher 1 (0.6) | PGMEA(1,500) CyH(200) |
| | 26 | Polymer 1 (80) | Novolak Resin 14 (20) | PAG 1 (4) | Quencher 1 (0.6) | PGMEA(1,500) CyH(200) |
| | 27 | Polymer 1 (80) | Novolak Resin 15 (20) | PAG 1 (4) | Quencher 1 (0.6) | PGMEA(1,500) CyH(200) |
| | 28 | Polymer 1 (80) | Novolak Resin 16 (20) | PAG 1 (4) | Quencher 1 (0.6) | PGMEA(1,500) CyH(200) |
| | 29 | Polymer 1 (80) | Novolak Resin 17 (20) | PAG 1 (4) | Quencher 1 (0.6) | PGMEA(1,500) CyH(200) |
| | 30 | Polymer 1 (80) | Novolak Resin 18 (20) | PAG 1 (4) | Quencher 1 (0.6) | PGMEA(1,500) CyH(200) |
| Comparative Example | 1 | Comparative Polymer 1 (80) | Novolak Resin 1 (20) | PAG 1 (4) | Quencher 1 (0.6) | PGMEA(1,500) CyH(200) |
| | 2 | Polymer 1 (100) | — | PAG 1 (4) | Quencher 1 (0.6) | PGMEA(1,500) CyH(200) |
| | 3 | Polymer 1 (80) | Comparative Novolak Resin 1 (20) | PAG 1 (4) | Quencher 1 (0.6) | PGMEA(1,500) CyH(200) |
| | 4 | Polymer 1 (80) | Comparative Novolak Resin 2 (20) | PAG 1 (4) | Quencher 1 (0.6) | PGMEA(1,500) CyH(200) |
| | 5 | Polymer 1 (80) | 1,5-dihydroxynaphthalene (20) | PAG 1 (4) | Quencher 1 (0.6) | PGMEA(1,500) CyH(200) |

ArF Lithography Test

The resist composition (Table 1) was spin coated onto a silicon substrate which had been vapor primed with hexamethyldisilazane (HMDS), and baked on a hot plate at 110° C. for 60 seconds to form a resist film of 200 nm thick. Using an ArF excimer laser scanner NSR-S307E (Nikon Corp., NA 0.85, σ 0.93, ⅔ annular illumination, 6% halftone phase shift mask), the resist film was exposed to a pattern having a line width of 90 nm and a pitch of 180 nm. Immediately after exposure, the resist film was baked (PEB) at the temperature shown in Table 2 for 60 seconds and developed with a 2.38 wt % aqueous solution of tetramethylammonium hydroxide for 30 seconds, forming a 90-nm line-and-space pattern. The sensitivity was determined, and the cross-sectional profile of the pattern was observed under SEM. The results are shown in Table 2.

TABLE 2

| | | PEB temp. (° C.) | Sensitivity (mJ/cm$^2$) | Profile |
|---|---|---|---|---|
| Example | 1 | 100 | 22 | rectangular, no sidewall roughness |
| | 2 | 100 | 26 | rectangular, no sidewall roughness |
| | 3 | 100 | 32 | rectangular, no sidewall roughness |
| | 4 | 110 | 28 | rectangular, no sidewall roughness |
| | 5 | 120 | 24 | rectangular, no sidewall roughness |
| | 6 | 120 | 24 | rectangular, no sidewall roughness |
| | 7 | 120 | 35 | rectangular, no sidewall roughness |
| | 8 | 100 | 33 | rectangular, no sidewall roughness |
| | 9 | 100 | 23 | rectangular, no sidewall roughness |
| | 10 | 95 | 21 | rectangular, no sidewall roughness |
| | 11 | 100 | 22 | rectangular, no sidewall roughness |
| | 12 | 100 | 22 | rectangular, no sidewall roughness |

TABLE 2-continued

|  |  | PEB temp. (° C.) | Sensitivity (mJ/cm²) | Profile |
|---|---|---|---|---|
|  | 13 | 100 | 26 | rectangular, no sidewall roughness |
|  | 14 | 100 | 24 | rectangular, no sidewall roughness |
|  | 15 | 100 | 29 | rectangular, no sidewall roughness |
|  | 16 | 100 | 26 | rectangular, no sidewall roughness |
|  | 17 | 100 | 24 | rectangular, no sidewall roughness |
|  | 18 | 110 | 24 | rectangular, no sidewall roughness |
|  | 19 | 110 | 29 | rectangular, no sidewall roughness |
|  | 20 | 105 | 26 | rectangular, no sidewall roughness |
|  | 21 | 100 | 29 | rectangular, no sidewall roughness |
|  | 22 | 100 | 30 | rectangular, no sidewall roughness |
|  | 23 | 100 | 28 | rectangular, no sidewall roughness |
|  | 24 | 100 | 27 | rectangular, no sidewall roughness |
|  | 25 | 100 | 29 | rectangular, no sidewall roughness |
|  | 26 | 100 | 28 | rectangular, no sidewall roughness |
|  | 27 | 100 | 32 | rectangular, no sidewall roughness |
|  | 28 | 100 | 33 | rectangular, no sidewall roughness |
|  | 29 | 100 | 22 | rectangular, no sidewall roughness |
|  | 30 | 100 | 27 | rectangular, no sidewall roughness |
| Comparative Example | 1 | 130 | 42 | tapered, film loss |
|  | 2 | 100 | 34 | substantially rugged sidewall due to standing waves |
|  | 3 | 100 | 31 | rectangular, rugged sidewall, scum in space |
|  | 4 | 100 | 45 | substantially tapered, space not opened |
|  | 5 | 100 | 16 | tapered, film loss |

Dry Etching Test

The resist composition (Table 1) was spin coated onto a silicon substrate and baked at 110° C. for 60 seconds to form a resist film of 200 nm thick. Using a dry etching instrument TE-8500 (Tokyo Electron Ltd.), the resist film was etched with $CF_4/CHF_3$ gas under the following conditions.

| Chamber pressure | 40.0 Pa |
|---|---|
| RF power | 1000 W |
| $CHF_3$ gas flow rate | 30 ml/min |
| $CF_4$ gas flow rate | 30 ml/min |
| Ar gas flow rate | 100 ml/min |
| Time | 60 sec |

The difference in resist film thickness before and after etching was determined, from which an etching rate per minute was computed. The results are shown in Table 3.

Adhesion Test

The resist composition (Table 1) was spin coated onto a silicon substrate which had not been vapor primed with HMDS, and baked on a hot plate at 110° C. for 60 seconds to form a resist film of 200 nm thick. Using an ArF excimer laser scanner NSR-S307E (Nikon Corp., NA 0.85, σ 0.93, conventional illumination, binary mask), the resist film was exposed to a pattern having a line width of 300 nm and a pitch of 600 nm. Immediately after exposure, the resist film was baked (PEB) at the temperature shown in Table 2 for 60 seconds and developed with a 2.38 wt % aqueous solution of tetramethylammonium hydroxide for 30 seconds. It was observed under an optical microscope whether or not the 300-nm line-and-space pattern was stripped. The results are shown in Table 3.

Step Coverage Test

A stepped substrate was prepared by forming a $SiO_2$ film of 300 nm thick on a silicon substrate and patterning the film to a pattern of holes having a diameter of 180 nm and a pitch of 360 nm. The resist composition was spin coated onto the stepped substrate under such conditions as to form a resist film of 200 nm on a flat substrate, and baked on a hot plate at 110° C. for 60 seconds. A cross section of the coated substrate was observed under SEM to see whether or not the holes in the oxide film were filled to the bottom with the resist film. The results are shown in Table 3.

TABLE 3

|  |  | Etching rate (nm/min) | Adhesion | Step coverage |
|---|---|---|---|---|
| Example | 1 | 125 | no stripping | holes filled to bottom |
|  | 2 | 115 | no stripping | holes filled to bottom |
|  | 3 | 112 | no stripping | holes filled to bottom |
|  | 4 | 129 | no stripping | holes filled to bottom |
|  | 5 | 126 | no stripping | holes filled to bottom |
|  | 6 | 122 | no stripping | holes filled to bottom |
|  | 7 | 128 | no stripping | holes filled to bottom |
|  | 8 | 122 | no stripping | holes filled to bottom |
|  | 9 | 118 | no stripping | holes filled to bottom |
|  | 10 | 123 | no stripping | holes filled to bottom |
|  | 11 | 124 | no stripping | holes filled to bottom |
|  | 12 | 123 | no stripping | holes filled to bottom |
|  | 13 | 126 | no stripping | holes filled to bottom |
|  | 14 | 125 | no stripping | holes filled to bottom |
|  | 15 | 125 | no stripping | holes filled to bottom |
|  | 16 | 125 | no stripping | holes filled to bottom |
|  | 17 | 126 | no stripping | holes filled to bottom |
|  | 18 | 116 | no stripping | holes filled to bottom |
|  | 19 | 117 | no stripping | holes filled to bottom |
|  | 20 | 120 | no stripping | holes filled to bottom |
|  | 21 | 105 | no stripping | holes filled to bottom |
|  | 22 | 108 | no stripping | holes filled to bottom |
|  | 23 | 115 | no stripping | holes filled to bottom |
|  | 24 | 112 | no stripping | holes filled to bottom |
|  | 25 | 104 | no stripping | holes filled to bottom |
|  | 26 | 107 | no stripping | holes filled to bottom |
|  | 27 | 106 | no stripping | holes filled to bottom |
|  | 28 | 102 | no stripping | holes filled to bottom |
|  | 29 | 102 | no stripping | holes filled to bottom |
|  | 30 | 96 | no stripping | holes filled to bottom |
| Comparative Example | 1 | 145 | no stripping | holes filled to bottom |
|  | 2 | 138 | stripped | holes not filled to bottom |
|  | 3 | 123 | stripped | holes filled to bottom |
|  | 4 | 133 | no stripping | holes filled to bottom |
|  | 5 | 133 | stripped | holes filled to bottom |

It is seen from Tables 2 and 3 that a resist composition based on a (meth)acrylate polymer with an acyclic acid labile group formed a pattern after development which had a tapered profile and low etch resistance (i.e., ion implantation resistance) because of insufficient dissolution inhibition of the acid labile group. Where a dihydroxynaphthalene novolak resin was not blended, step coverage and adhesion were insufficient. Where a novolak resin of naphthalene having one hydroxyl group was blended, adhesion was insufficient, and scum was left in the space area of the resist pattern after development. Where a cresol novolak resin was blended, a pattern of perpendicular profile could not be formed by the ArF lithography owing to strong absorption. Where dihydroxynaphthalene monomer was blended, the resist pattern had a tapered profile because of accelerated acid diffusion and alkaline dissolution rate. Those resist compositions comprising a blend of a (meth)acrylate polymer having a cyclic acid labile group and a dihydroxynaphthalene novolak resin exhibit satisfactory resolution, sensitivity, pattern profile, adhesion, and etch resistance, indicating fully acceptable properties as the resist material subject to the ion implantation process.

Japanese Patent Application No. 2011-040065 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A positive resist composition comprising a polymer comprising recurring units (a) of (meth)acrylate having a carboxyl group substituted with an acid labile group of cyclic structure, represented by the general formula (1) below, and recurring units (b) having an adhesive group selected from the group consisting of hydroxyl, carboxyl, lactone ring, carbonate, thiocarbonate, carbonyl, cyclic acetal, ether, ester, sulfonic acid ester, cyano, and amide groups, copolymerized therewith, wherein "a" and "b" indicative of molar ratios of the respective units are in the range: 0<a<1.0, 0<b<1.0, and 0.2≤a+b≤1.0, the polymer having a weight average molecular weight of 1,000 to 500,000, and a novolak resin as base resin, and a photoacid generator,

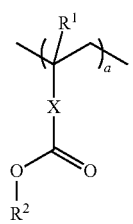
(1)

wherein $R^1$ is hydrogen or methyl, X is a single bond, a linking group of 1 to 12 carbon atoms containing at least one member selected from among an ester moiety, ether moiety and lactone ring, or a naphthylene group, and $R^2$ is an acid labile group of cyclic structure, the novolak resin being one selected from the group consisting of the following formulae:

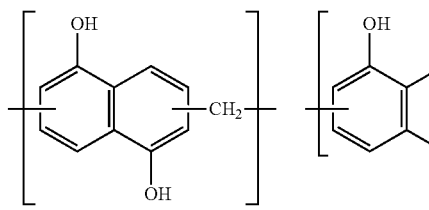

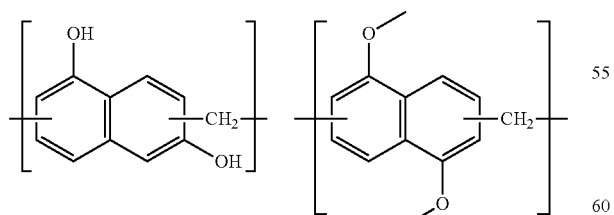

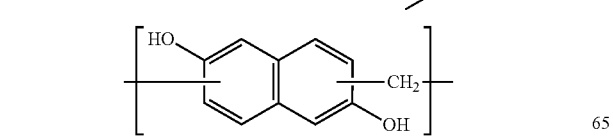

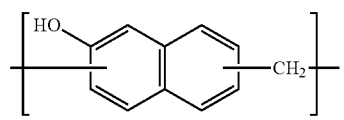

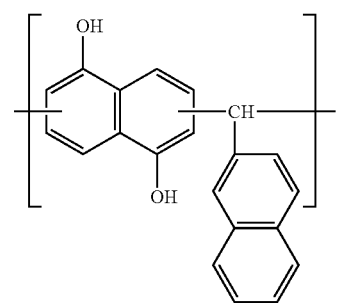

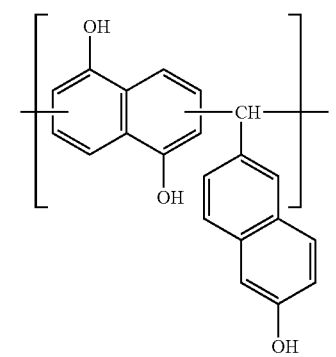

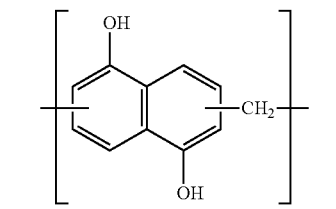

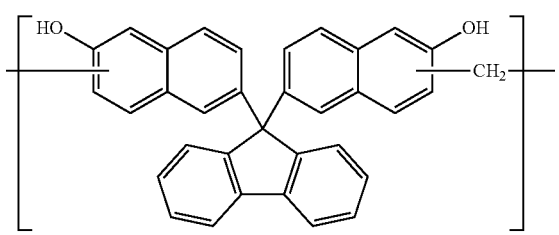

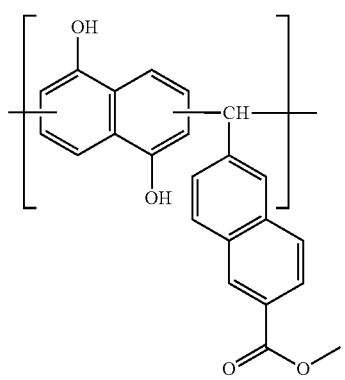

-continued

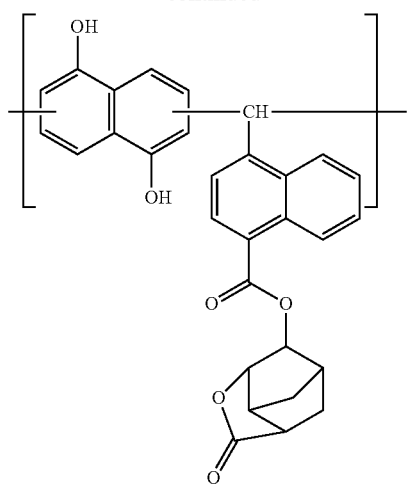

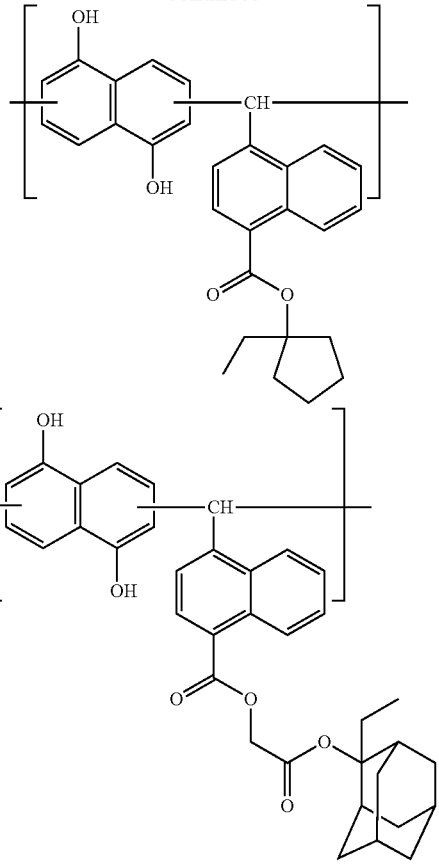

2. The resist composition of claim 1 which is a chemically amplified resist composition further comprising an organic solvent.

3. The resist composition of claim 2, further comprising a basic compound and/or a surfactant as additive.

4. A pattern forming process comprising the steps of coating the positive resist composition of claim 1 onto a substrate, baking, exposing to high-energy radiation, and developing with a developer to form a resist pattern.

5. The process of claim 4 wherein the high-energy radiation is ArF excimer laser.

6. The process of claim 4, further comprising the step of ion implantation into the substrate after the step of developing with a developer to form a resist pattern.

* * * * *